(12) United States Patent
Koyama

(10) Patent No.: US 8,659,516 B2
(45) Date of Patent: Feb. 25, 2014

(54) DISPLAY DEVICE

(71) Applicant: Semiconductor Energy Laboratory Co., Ltd., Atsugi (JP)

(72) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/650,441

(22) Filed: Oct. 12, 2012

(65) Prior Publication Data

US 2013/0093650 A1 Apr. 18, 2013

Related U.S. Application Data

(60) Division of application No. 12/796,052, filed on Jun. 8, 2010, now Pat. No. 8,289,241, which is a division of application No. 10/879,032, filed on Jun. 30, 2004, now Pat. No. 7,742,020, which is a continuation of application No. 09/876,580, filed on Jun. 5, 2001, now Pat. No. 6,760,004.

(30) Foreign Application Priority Data

Jun. 6, 2000 (JP) ................................. 2000-168331

(51) Int. Cl.
*G09G 3/30* (2006.01)

(52) U.S. Cl.
USPC ............... 345/76; 345/98; 345/100; 345/204; 345/690; 315/169.1; 315/169.3

(58) Field of Classification Search
USPC ..................... 345/47, 76–100, 204, 690–693; 257/351, 344, 412, 69, 72, 59, 408
See application file for complete search history.

(56) References Cited

U.S. PATENT DOCUMENTS

| | | |
|---|---|---|
| 5,247,190 A | 9/1993 | Friend et al. |
| 5,399,502 A | 3/1995 | Friend et al. |
| 5,594,463 A | 1/1997 | Sakamoto |

(Continued)

FOREIGN PATENT DOCUMENTS

| | | |
|---|---|---|
| EP | 1047039 A1 | 10/2000 |
| JP | 62-284390 A | 12/1987 |

(Continued)

OTHER PUBLICATIONS

Schenk, et al., "Polymers for Light Emitting Diodes", EuroDisplay '99, The 19th International Display Research Conference Proceedings, pp. 33-37, Sep. 1999.

*Primary Examiner* — Jennifer Nguyen
(74) *Attorney, Agent, or Firm* — Fish & Richardson P.C.

(57) ABSTRACT

A signal line driving circuit which includes a digital signal sampling circuit, a storage circuit, a time setting circuit and a constant current circuit, is fabricated of TFTs on an insulating substrate which is made of the same substance as that of a pixel portion substrate. Thus, in a passive type EL display device, the problem of a distortion in the case of bonding the signal line driving circuit onto the pixel portion substrate can be eliminated. Besides, in an active type EL display device, each pixel is constructed of one transistor and an EL element. Thus, the aperture factor of the EL display device is enlarged.

29 Claims, 24 Drawing Sheets

(56) References Cited

U.S. PATENT DOCUMENTS

| | | |
|---|---|---|
| 5,625,201 A | 4/1997 | Holm et al. |
| 5,714,968 A | 2/1998 | Ikeda |
| 5,789,762 A | 8/1998 | Koyama et al. |
| 5,856,686 A | 1/1999 | Watanabe et al. |
| 5,940,053 A | 8/1999 | Ikeda |
| 5,952,789 A | 9/1999 | Stewart et al. |
| 5,990,629 A | 11/1999 | Yamada et al. |
| 6,008,588 A | 12/1999 | Fujii |
| 6,011,529 A | 1/2000 | Ikeda |
| 6,121,943 A | 9/2000 | Nishioka et al. |
| 6,127,993 A | 10/2000 | Ohba et al. |
| 6,169,528 B1 | 1/2001 | Oguchi et al. |
| 6,204,906 B1* | 3/2001 | Tannas, Jr. ............ 349/153 |
| 6,229,505 B1 | 5/2001 | Fujii |
| 6,246,387 B1 | 6/2001 | Yamazaki |
| 6,310,589 B1 | 10/2001 | Nishigaki et al. |
| 6,326,935 B1 | 12/2001 | Boger |
| 6,332,661 B1* | 12/2001 | Yamaguchi ............ 327/108 |
| 6,362,798 B1 | 3/2002 | Kimura et al. |
| 6,417,898 B1* | 7/2002 | Izumi ............ 349/73 |
| 6,424,331 B1 | 7/2002 | Ozawa |
| 6,429,601 B1 | 8/2002 | Friend et al. |
| 6,556,176 B1 | 4/2003 | Okuyama et al. |
| 6,597,489 B1* | 7/2003 | Guarr et al. ............ 359/266 |
| 6,724,149 B2 | 4/2004 | Komiya et al. |
| 7,141,821 B1 | 11/2006 | Yamazaki et al. |
| 2001/0048502 A1* | 12/2001 | Moon et al. ............ 349/153 |
| 2002/0105493 A1 | 8/2002 | Komiya |
| 2002/0145602 A1 | 10/2002 | Matsueda |
| 2002/0149556 A1 | 10/2002 | Matsueda |
| 2002/0163000 A1 | 11/2002 | Yamazaki |

FOREIGN PATENT DOCUMENTS

| | | |
|---|---|---|
| JP | 04-042619 A | 2/1992 |
| JP | 5-165413 A | 7/1993 |
| JP | 07-036409 A | 2/1995 |
| JP | 7-306660 A | 11/1995 |
| JP | 08-054836 A | 2/1996 |
| JP | 10-092576 A | 4/1998 |
| JP | 10-112391 A | 4/1998 |
| JP | 10-133232 A | 5/1998 |
| JP | 10-319908 A | 12/1998 |
| WO | WO 90/13148 A1 | 11/1990 |
| WO | WO 00/23977 A1 | 4/2000 |

* cited by examiner

S1
TO SOURCE SIGNAL LINE

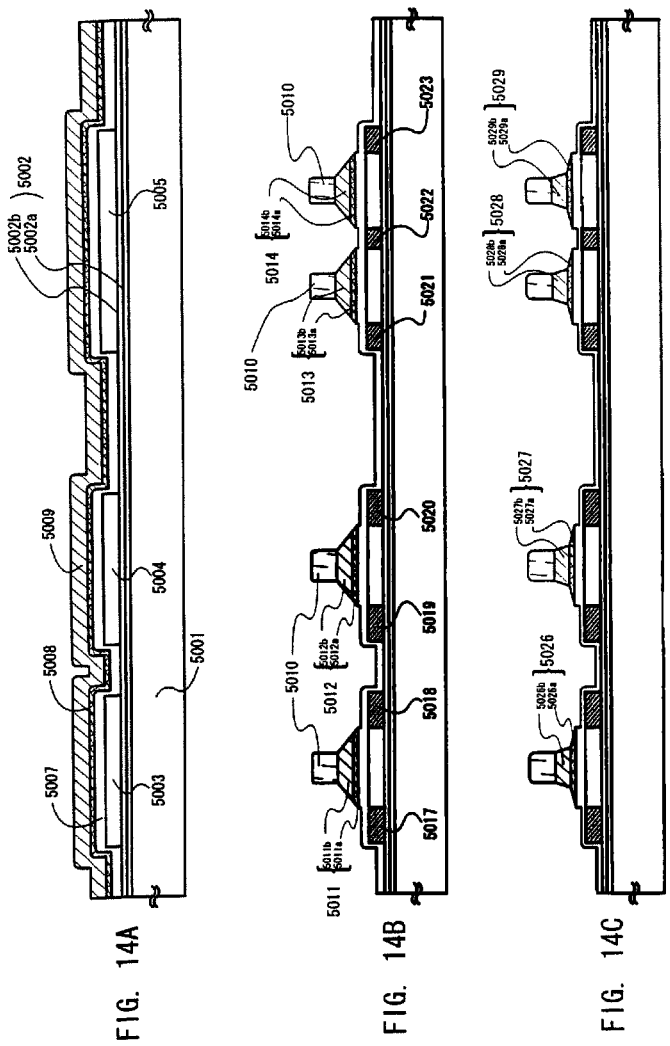

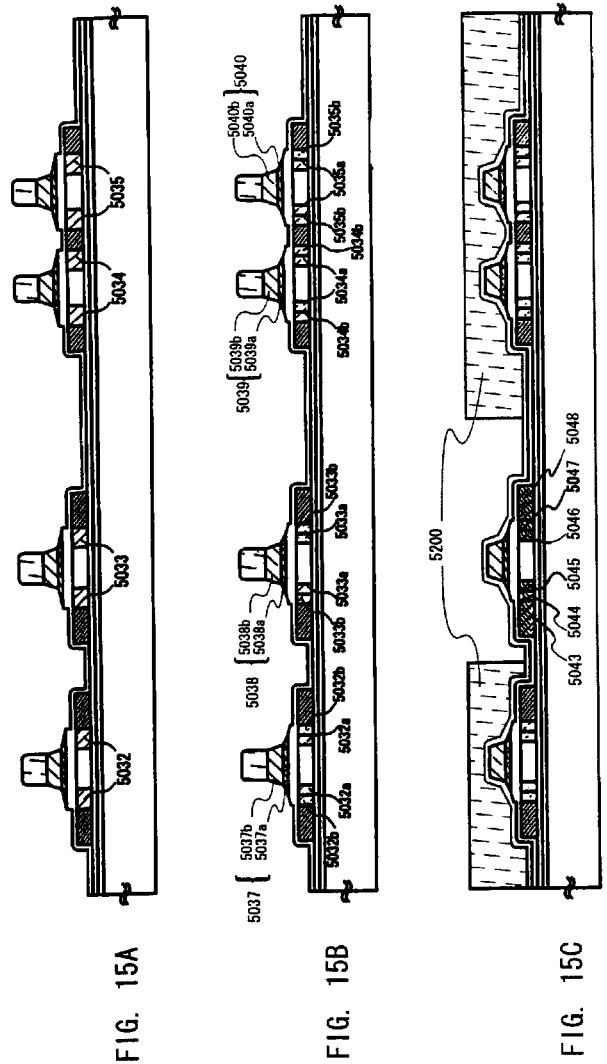

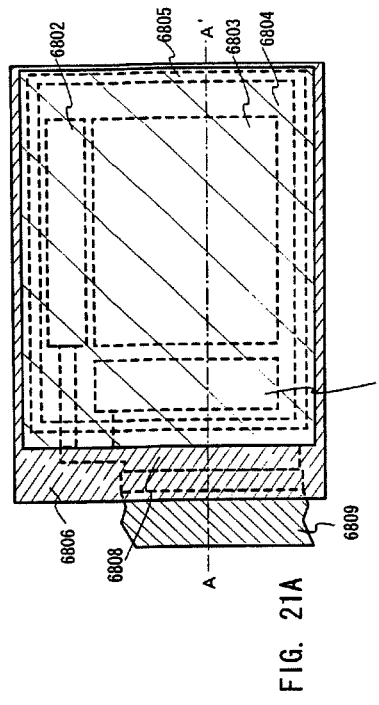
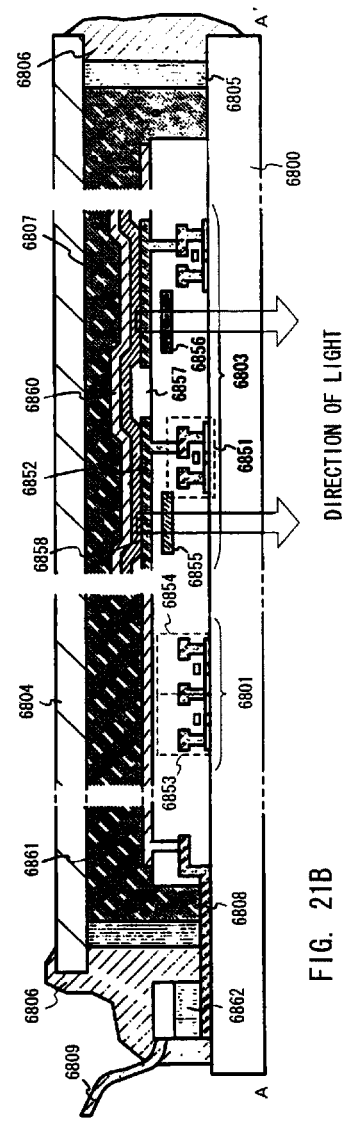
FIG. 21A
FIG. 21B

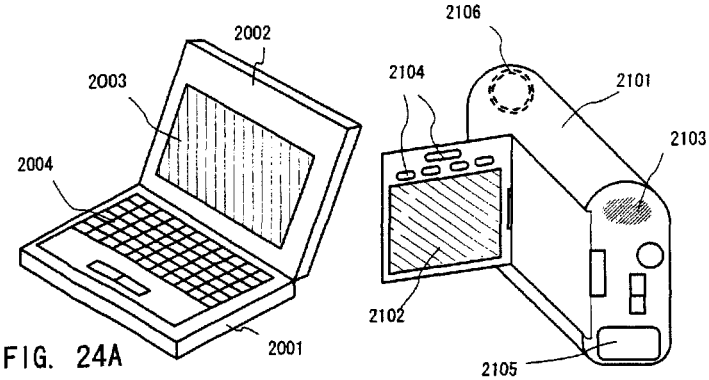
FIG. 24A
FIG. 24B
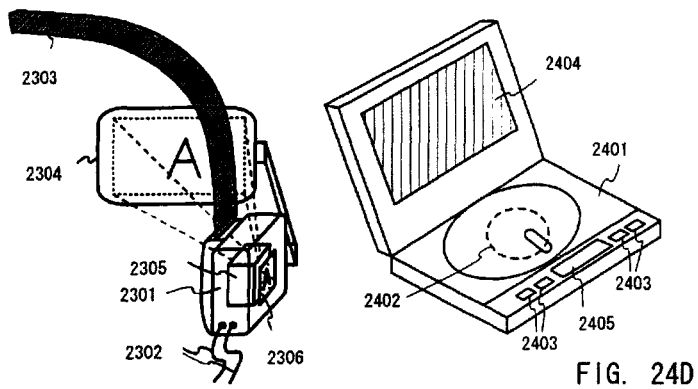
FIG. 24C
FIG. 24D
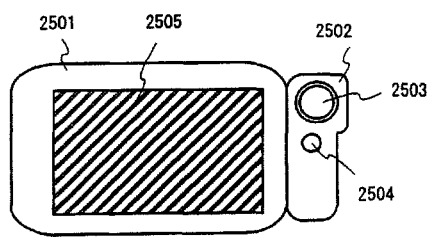
FIG. 24E

DISPLAY DEVICE

CROSS-REFERENCE TO RELATED APPLICATIONS

This application is a divisional of U.S. application Ser. No. 12/796,052, filed Jun. 8, 2010, now allowed, which is a divisional of U.S. application Ser. No. 10/879,032, filed Jun. 30, 2004, now U.S. Pat. No. 7,742,020, which is a continuation of U.S. application Ser. No. 09/876,580, filed Jun. 5, 2001, now U.S. Pat. No. 6,760,004, which claims the benefit of a foreign priority application filed in Japan as Serial No. 2000-168331 on Jun. 6, 2000, all of which are incorporated by reference.

BACKGROUND OF THE INVENTION

1. Field of the Invention

The present invention relates to an electronic display device which is formed having an EL (electroluminescent) element on a substrate. More particularly, it relates to a display device which employs a semiconductor element (an element including a semiconductor thin film). Also, it relates to an electronic equipment whose display portion includes an EL display device.

2. Description of the Related Art

In recent years, EL display devices each having an EL element as a self-emission type element have been vigorously developed. The EL display device is also called the "organic EL display (OELD)" or "organic light emitting diode (OLED)".

Unlike a liquid crystal display device, the EL display device is of self-emission type. The EL element has a construction wherein an EL layer is sandwiched in between a pair of electrodes (an anode and a cathode), and wherein the EL layer has a multilayer structure ordinarily. Typically mentioned is the multilayer structure of "hole transporting layer/light emitting layer/electron transporting layer" proposed by Tang et al., Eastman Kodak Company. The multilayer structure exhibits a very high emission efficiency, and most of the EL display devices being currently under researches and developments adopt this structure.

Alternatively, the multilayer structure may be so formed that the anode is successively overlaid with a hole injecting layer/a hole transporting layer/a light emitting layer/an electron transporting layer, or a hole injecting layer/a hole transporting layer/a light emitting layer/an electron transporting layer/an electron injecting layer. The light emitting layer may well be doped with a fluorescent coloring matter or the like.

In this specification, all layers interposed between the cathode and the anode shall be generally termed the "EL layer". Accordingly, the hole injecting layer, hole transporting layer, light emitting layer, electron transporting layer and electron injecting layer mentioned above are all included in the "EL layer".

Herein, a predetermined voltage is applied to the EL layer of the above structure by the pair of electrodes, whereby light is emitted by the recombination of carriers taking place in the light emitting layer. In this specification, the light emission of the EL element shall be called the "drive of the EL element". Also in this specification, a light emitting element which is constituted by the anode, EL layer and cathode shall be called the "EL element".

Here, in this specification, the "EL element" shall cover both light emission (fluorescence) from a singlet exciton and light emission (phosphorescence) from a triplet exciton.

The driving systems of EL display devices include a passive system and an active system.

The passive type EL display device has a structure wherein stripe-like anodes (transparent electrodes) formed on an insulating substrate, organic EL layers, and stripe-like cathodes formed so as to intersect orthogonally to the anodes are stacked in succession. The equivalent circuit of the passive type EL display device is shown in FIG. 2. According to the passive system, one of scanning lines is selected, and among pixels lying on the selected scanning line, only ones whose signal lines are ON states emit light.

Signals to be inputted to the signal lines are created in such a way that a data signal (video signal) externally inputted is edited by a signal line driving circuit. Here in the passive type EL display device, the signal line driving circuit is disposed in such a way that an IC chip is mounted on the display device by TAB (Tape Automated Bonding), or that the IC chip is assembled in the display device by bonding it directly onto the pixel substrate. The IC chip is so constructed that a circuit is formed on a semiconductor substrate such as silicon chip. In the case of bonding the IC chip directly onto the pixel substrate, accordingly, the semiconductor substrate is bonded onto the insulating substrate used as the pixel substrate.

On the other hand, the active type EL display device is constructed of EL elements, and gate signal lines, source signal lines, power supply lines, transistors and capacitors which are formed on an insulating substrate. One of the capacitors and two of the transistors are disposed for each of the pixels of the display device.

In general, the active type EL display device has a structure wherein two or more transistors are disposed for each pixel.

In the active type EL display device, the pixel is formed in such a way that the transistors are fabricated on the insulating substrate by employing semiconductor thin films. Here, the transistors formed by employing the semiconductor thin films are called the "thin film transistors (hereinbelow, abbreviated to "TFTs")".

The circuit diagram of the pixel of the active type EL display device is shown in FIG. 3.

The gate electrode of the switching TFT is connected to the gate signal line. One of the source region and drain region of the switching TFT is connected with the source signal line, while the other is connected with the gate electrode of the EL driving TFT and one electrode of the capacitor. One of the source region and drain region of the EL driving TFT is connected with the anode or cathode of the EL element, while the other is connected with the power supply line. That electrode of the capacitor which is not connected with the switching TFT, is connected with the power supply line.

In the pixel for which both the gate signal line and the source signal line have turned ON, charges are stored in the capacitor through the switching TFT. During a time period for which the capacitor continues to apply a voltage to the gate electrode of the EL driving TFT, current continues to flow from the power supply line to the EL element through the EL driving TFT, and the EL element continues to emit light.

Signals to be inputted to the source signal lines are created in such a way that a data signal externally inputted is edited by a source signal line driving circuit. In the active type EL display device, the source signal line driving circuit can be fabricated of TFTs on the insulating substrate simultaneously with the circuits of the pixel portion of the display device.

An analog driving method (analog drive) is mentioned as the driving method of the active type EL display device. The analog drive will be explained with reference to FIGS. 4 and 5.

FIG. 4 shows the structure of the pixel portion of the active type EL display device conforming to the analog drive. Gate signal lines (G1-Gy) to which selection signals from a gate signal line driving circuit are respectively inputted, are connected to the gate electrodes of switching TFTs 1801 included in individual pixels. Besides, either regions of the source regions and drain regions of the switching TFTs 1801 included in the individual pixels are connected to source signal lines (also called "data signal lines") (S1-Sx) to which analog signals are respectively inputted, while the other regions are connected to the gate electrodes of EL driving TFTs 1804 included in the individual pixels and also to capacitors 1808 included in the individual pixels.

Either regions of the source regions and drain regions of the EL driving TFTs 1804 included in the individual pixels are connected to power supply lines (V1-Vx), while the other regions are connected to EL elements 1806. The potentials of the power supply lines (V1-Vx) are called "power source potentials". Besides, the power supply lines (V1-Vx) are connected to the capacitors 1808 included in the individual pixels.

Each of the EL elements 1806 includes an anode, a cathode, and an EL layer which is interposed between the anode and the cathode. In a case where the anode of the EL element 1806 is connected with the source region or drain region of the EL driving TFT 1804, this anode of the EL element 1806 serves as a pixel electrode, and the cathode thereof serves as a counter electrode. To the contrary, in a case where the cathode of the EL element 1806 is connected with the source region or drain region of the EL driving TFT 1804, the anode of the EL element 1806 serves as a counter electrode, and the cathode thereof serves as a pixel electrode.

Here in this specification, the potential of the counter electrode shall be called the "counter potential". Also, a power source for applying the counter potential to the counter electrode shall be called the "counter power source". The potential difference between the potential of the pixel electrode and that of the counter electrode is an "EL driving voltage", which acts across the EL layer.

FIG. 5 shows a timing chart in the case where the active type EL display device depicted in FIG. 4 is driven by the analog driving method. A time period from the selection of one of the gate signal lines till the next selection of another, is called "one line period (L)". Besides, a time period from the display of one image till the display of the next image corresponds to "one frame period (F)". In the case of the active type EL display device depicted in FIG. 4, the gate signal lines are laid in the number y, and hence, y line periods (L1-Ly) are provided within one frame period.

As the resolution of the display device becomes higher, the number of the line periods within one frame period enlarges more, and the driving circuit must be driven at a higher frequency.

First, the power supply lines (V1-Vx) are held at a predetermined power source potential. Also, the counter potential being the potential of each counter electrode is held at a predetermined potential. The counter potential has a potential difference from the power source potential to the extent that the EL element emits light.

In the first line period (L1), the selection signal from the gate signal line driving circuit is inputted to the gate signal line G1. Besides, the analog signals are successively inputted to the source signal lines (S1-Sx). Since all the switching TFTs connected to the gate signal line G1 fall into their ON states, the analog signals inputted to the source signal lines are respectively inputted to the gate electrodes of the EL driving TFTs through the corresponding switching TFTs.

Here, the "ON state" of each TFT shall signify that the source-drain path of the TFT has been brought into a conductive state by the gate voltage of the TFT.

The quantity of current flowing through the channel forming region of the EL driving TFT is controlled by the magnitude of the potential (the voltage) of the signal which is inputted to the gate electrode of this TFT. Therefore, the potential acting on the pixel electrode of the EL element is determined by the magnitude of the potential of the analog signal which is inputted to the gate electrode of the EL driving TFT. That is, the EL element emits the light under the control by the potential of the analog signal.

When the analog signals have been inputted to all the source signal lines (S1-Sx) by iterating the above operations, the first line period (L1) ends. Incidentally, one line period may well be set at a sum obtained by adding a horizontal retrace period to the time period in which the analog signals are inputted to all the source signal lines (S1-Sx). Subsequently, the second line period (L2) starts, and the selection signal is inputted to the gate signal line G2. Besides, the analog signals are successively inputted to the source signal lines (S1-Sx) as in the first line period (L1).

In due course, when the selection signals have been inputted to all the gate signal lines (G1-Gy), all the line periods (L1-Ly) end. When all the line periods (L1-Ly) have ended, one frame period ends. During one frame period, all the pixels present displays, and one image is formed. Incidentally, one frame period may well be set at a sum obtained by adding a vertical retrace period to all the line periods (L1-Ly).

In the above way, the quantity of light emission of the EL element is controlled by the analog signal, and a gradation display is presented by the control of the quantity of light emission. In this method, the gradation display is presented by variation in the potential of the analog signal which is inputted to the source signal line.

FIG. 6A is a graph showing the transistor characteristic of the EL driving TFT. The transistor characteristic 401 is called the "Id-Vg characteristic" (or "Id-Vg curve"). Here, symbol Id denotes a drain current, and symbol Vg denotes a gate voltage. The quantity of current which flows versus any gate voltage, can be known from the graph.

Usually, the region of the Id-Vg characteristic as indicated by a broken line 402 is used in driving the EL element. The enlarged diagram of the enclosed region 402 is shown in FIG. 6B.

In FIG. 6B, a hatched region is called a "subthreshold region". In actuality, the subthreshold region signifies a region which corresponds to the gate voltage equal to or lower than a threshold voltage (Vth). In this region, the drain current varies exponentially versus the variation of the gate voltage. A current control based on the gate voltage is performed using the region.

The analog signal inputted into the pixel by the turn-ON of the switching TFT becomes the gate voltage of the EL driving TFT. On this occasion, the drain current is determined in one-to-one correspondence with the gate voltage in accordance with the Id-Vg characteristic shown in FIG. 6A. More specifically, the potential of the drain region (an EL driving potential in the ON state) is determined in correspondence with the voltage of the analog signal inputted to the gate electrode of the EL driving TFT, the predetermined drain current flows through the EL element, and the EL element emits the light in the quantity of light emission corresponding to the quantity of the current.

As explained above, the quantity of light emission of the EL element is controlled by the analog signal, and the gradation display is presented.

With the passive type EL display device, in the case of employing the TAB for assembling the signal line driving circuit, there is the problem that an area required for the TAB is difficult to be made small, so reduction in the size of the display device is difficult. Meanwhile, when the IC chip is bonded directly onto the substrate formed with the pixel portion, the surface of the bonding between the semiconductor substrate of the IC chip and the insulating substrate of the pixel portion becomes an interface where different kinds of substances are bonded. This poses the problem that a distortion is induced at the interface by a temperature change on account of the difference between the thermal expansion coefficients of the substances. The distortion disturbs the structure of the driving circuit, and forms one of causes for spoiling the reliability of the passive type EL display device.

On the other hand, with the active type EL display device, the source signal line driving circuit can be fabricated on the insulating substrate simultaneously with the circuits of the pixel portion. Therefore, the active type EL display device is free from the problems of the passive type one in the case of assembling the source signal line driving circuit. Regarding the construction of the pixel portion, however, the two transistors are arranged every pixel. This poses the problem that, as the pixel becomes smaller, a proportion occupied by the transistors within the pixel enlarges more, so the aperture factor of the pixel, in turn, the display device lessens.

SUMMARY OF THE INVENTION

An object of the present invention is to eliminate the problem of the distortion of the interface between an IC chip and a pixel portion substrate, the problem being posed in case of assembling a signal line driving circuit in the shape of the IC chip in the fabrication of a passive type EL display device.

Another object of the present invention is to fabricate an active type EL display device of large aperture factor.

Heretofore, in the passive type EL display device, it has been one of causes for spoiling the reliability of the display device that the signal line driving circuit formed on a semiconductor substrate is bonded onto the pixel portion substrate. Therefore, the signal line driving circuit is fabricated on an insulating substrate made of the same substance as that of the pixel portion substrate. Thus, when the signal line driving circuit is bonded onto the pixel portion substrate, the interface between them becomes the interface of the bonding between the substrates made of the same substance and exhibiting equal thermal expansion coefficients, so that the problem of the distortion can be eliminated.

Also, heretofore, in the active type EL display device, it has been one of causes for lessening the aperture factor of the display device that two transistors are arranged every pixel. Therefore, each pixel is constructed of one transistor and an EL element. Thus, the aperture factor of the EL display device is enlarged.

The features of the present invention will be summarized below.

According to the present invention, there is provided a display device having a plurality of signal lines, and a signal line driving circuit; characterized in that the signal line driving circuit comprises a digital signal sampling circuit which samples an inputted digital signal over one line period, a storage circuit which stores therein the sampled digital signals for one line period, a time setting circuit which converts the stored digital signals into pulses of corresponding durations, and a constant current circuit which outputs currents of constant value to the signal lines for the durations of the pulses.

Also, according to the present invention, there is provided a display device of active type having a plurality of source signal lines, and a source signal line driving circuit; characterized in that the source signal line driving circuit comprises a digital signal sampling circuit which samples an inputted digital signal over one line period, a storage circuit which stores therein the sampled digital signals for one line period, a time setting circuit which converts the stored digital signals into pulses of corresponding durations, and a constant current circuit which outputs currents of constant value to the signal lines for the durations of the pulses.

The display device may well be characterized in that said signal line driving circuit is constructed using TFTs.

The display device may well be characterized in that said source signal line driving circuit is constructed using TFTs.

Further, according to the present invention, there is provided a display device having a plurality of source signal lines, a plurality of gate signal lines, a plurality of pixels, a source signal line driving circuit for inputting signals to the plurality of source signal lines, and a gate signal line driving circuit for inputting signals to the plurality of gate signal lines; characterized in that each of the plurality of pixels includes an EL element, and one switching TFT; that a gate electrode of said switching TFT is connected with one of said plurality of gate signal lines; and that either of a source region and a drain region of said switching TFT is connected with one of said plurality of source signal lines, while the other region of said switching TFT is connected with either of a cathode and an anode included in said EL element.

The display device may well be characterized in that the source signal line driving circuit comprises a digital signal sampling circuit which samples an inputted digital signal over one line period, a storage circuit which stores therein the sampled digital signals for one line period, a time setting circuit which converts the stored digital signals into pulses of corresponding durations, and a constant current circuit which outputs currents of constant value to the signal lines for the durations of the pulses.

The display device may well be characterized in that said EL element includes an EL layer which emits monochromatic light, and which can present a color display in combination with a color conversion layer.

The display device may well be characterized in that said EL element includes an EL layer which emits white light, and which can present a color display in combination with a color filter.

The display device may well be characterized in that said EL layer is made of a low-molecular organic substance or a high polymer type organic substance.

The display device may well be characterized in that said low-molecular organic substance is Alq$_3$ (tris-8-quinolinolato-aluminum) or a TPD (triphenylamine derivative).

The display device may well be characterized in that said high polymer type organic substance is PPV (polyphenylene vinylene), PVK (polyvinyl carbazole) or polycarbonate.

The display device may well be characterized in that said EL layer is made of an inorganic substance.

A computer, a video camera or a DVD player may well be characterized by including the display device.

BRIEF DESCRIPTION OF THE DRAWINGS

FIGS. 14A through 14C are sectional views showing the manufacturing steps of an EL display device embodying the present invention;

FIGS. 15A through 15C are sectional views showing the manufacturing steps of the EL display device embodying the present invention;

FIGS. 21A and 21B are a top plan view and a vertical sectional view of the pixel portion of an EL display device embodying the present invention, respectively;

FIGS. 24A through 24E are views each showing an electronic equipment which employs an EL display device according to the present invention.

PREFERRED EMBODIMENTS OF THE INVENTION

Figure 1:
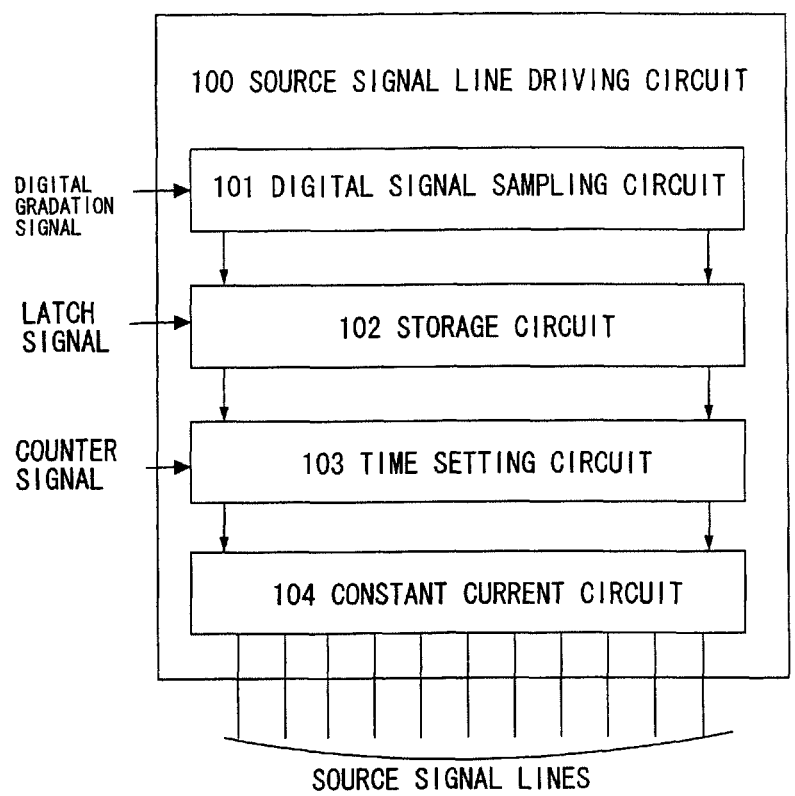
FIG. 1 is a block diagram showing the construction of the source signal line driving circuit of an EL display device according to the present invention.

The structure and driving method of the source signal line driving circuit of an EL display device according to the present invention will be described below. FIG. 1 shows the construction of the source signal line driving circuit of the EL display device according to the present invention.

The source signal line driving circuit 100 is constructed of a digital signal sampling circuit 101, a storage circuit 102, a time setting circuit 103 and a constant current circuit 104.

A digital signal (digital gradation signal) is inputted to the digital signal sampling circuit 101. The digital gradation signal is sampled over one line period, and the sampled digital gradation signals for one line period are held in the storage circuit 102. The sampled digital gradation signals held in the storage circuit 102 are outputted from the storage circuit 102 into the time setting circuit 103 in accordance with a latch signal. The sampled digital gradation signals inputted to the time setting circuit 103 are converted into pulses of lengths corresponding to these signals, by their comparisons with a counter signal. The pulses are inputted to the constant current circuit 104. Currents are outputted to source signal lines for time periods which conform to the lengths of the inputted pulses.

The source signal line driving circuit of the EL display device according to the present invention can be fabricated on an insulating substrate by employing TFTs. Thus, the source signal line driving circuit of current output type fabricated on the insulating substrate can be obtained.

Figure 2:
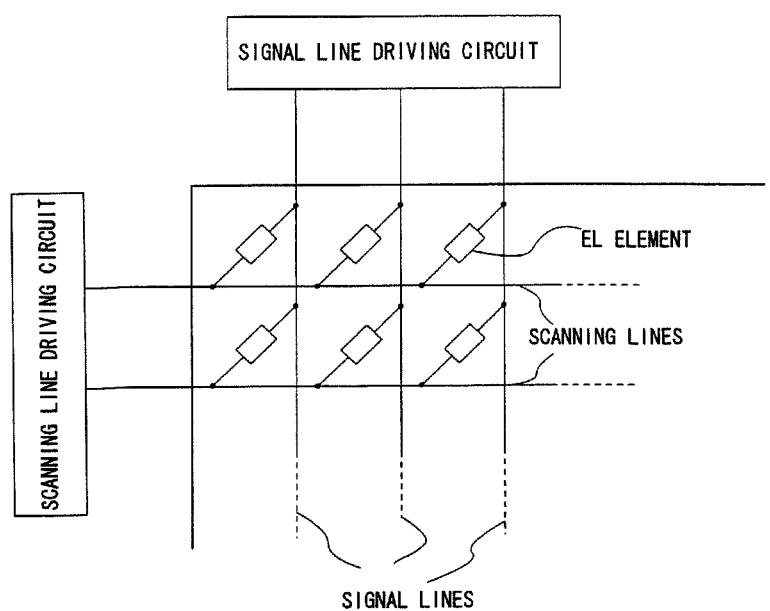
FIG. 2 is an equivalent circuit diagram of the pixel portion of a passive type EL display device in the prior art.
Figure 3:
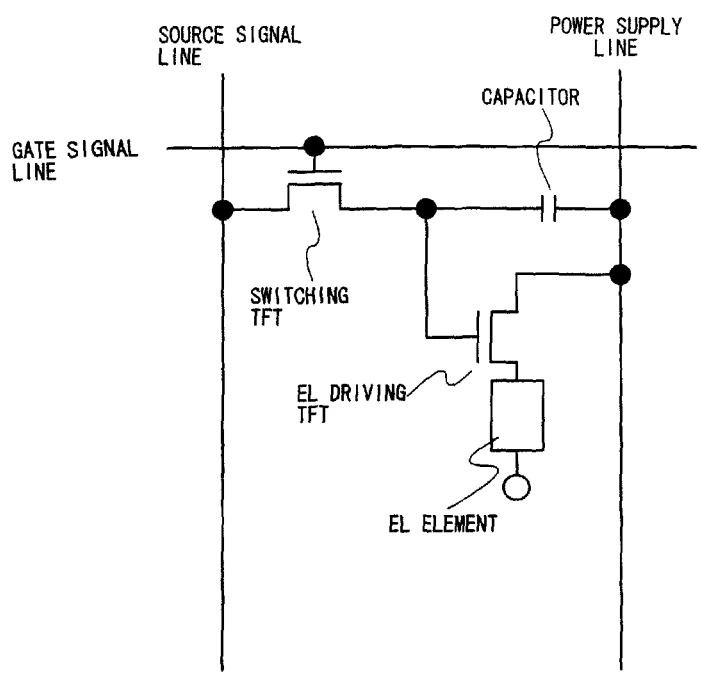
FIG. 3 is a circuit diagram of the pixel of an active type EL display device in the prior art.
Figure 4:
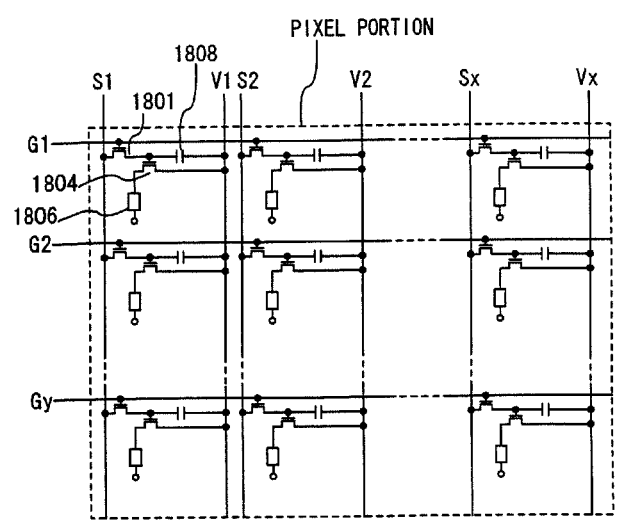
FIG. 4 is a circuit diagram of the pixel portion of the active type EL display device in the prior art.
Figure 5:
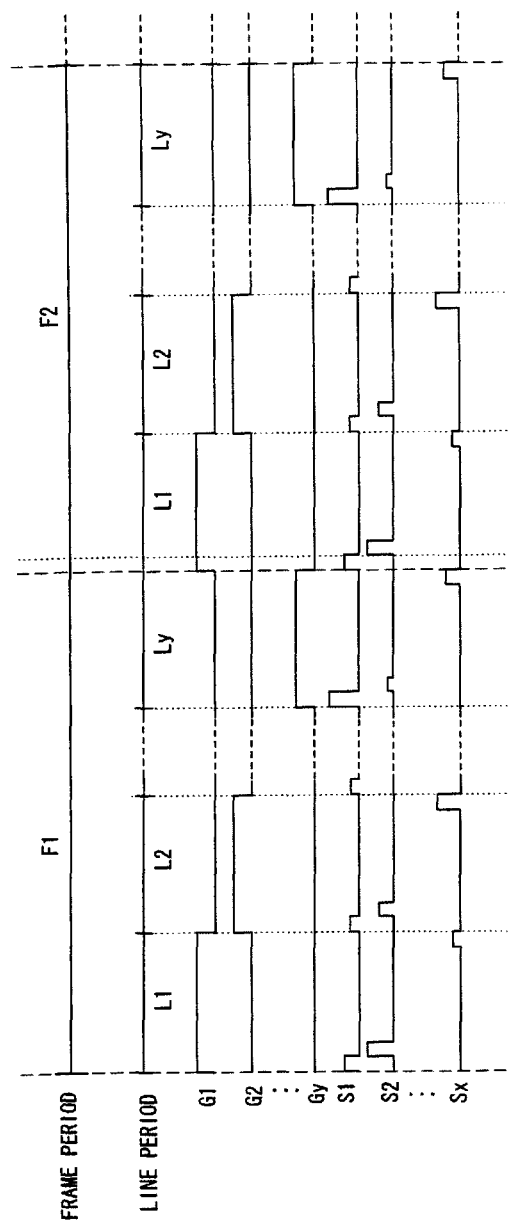
FIG. 5 is a timing chart showing the driving method of the active type EL display device in the prior art.
Figure 6A:
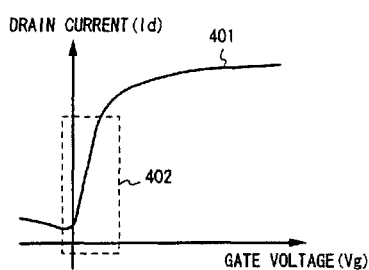
FIGS. 6A and 6B are graphs each showing the Id-Vg characteristic of a TFT.
Figure 6B:
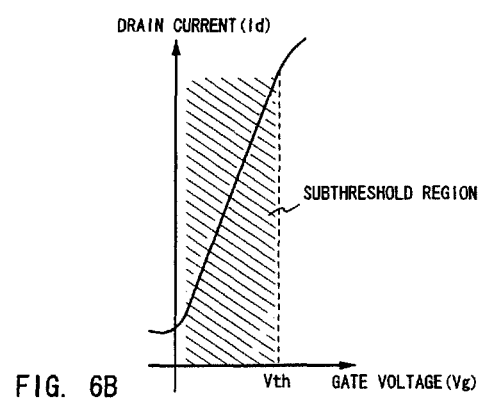

When the source signal line driving circuit is applied to the signal line driving circuit shown in FIG. 2 referred to before, any drawback ascribable to the distortion of a substrate can be solved in a passive type EL display device.

Figure 12:
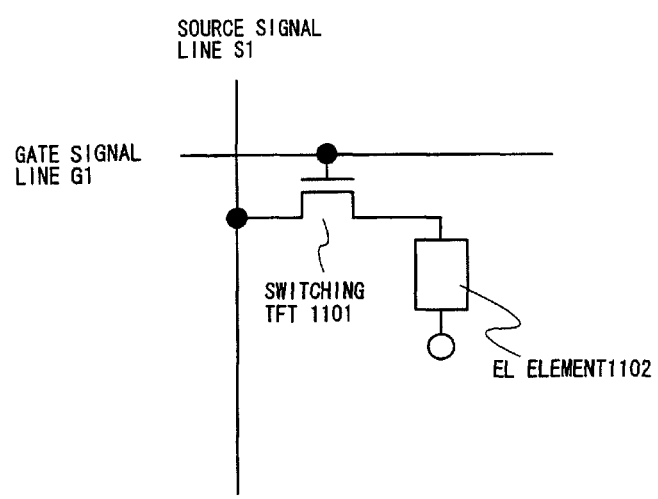
FIG. 12 is a diagram showing the construction of the pixel of an EL display device according to the present invention.

Next, the construction of each pixel of an active type EL display device according to the present invention will be described. FIG. 12 shows the construction of the pixel of the active type EL display device according to the present invention. The pixel is constructed of a switching TFT 1101 and an EL element 1102. In the illustrated part of the display device, a gate signal line G1 and a source signal line S1 are laid. The gate signal line G1 is connected to the gate electrode of the switching TFT 1101. Besides, one of the source region and drain region of the switching TFT 1101 is connected to the source signal line S1, while the other is connected to the EL element 1102.

In the pixel, the switching TFT 1101 is turned ON when a signal is inputted to the gate signal line G1. In a case where current is inputted from a source line driving circuit to the source signal line S1 on this occasion, current flows to the EL element 1102 through the switching TFT 1101 for a time period conforming to a gradation signal, and the EL element 1102 emits light. In this manner, the light emission of the EL element 1102 is controlled by the current inputted to the source signal line, so as to present a gradation display.

In the active type EL display device according to the present invention, each pixel is constructed of one TFT and the EL element. Thus, the aperture factor of the active type EL display device can be enlarged.

Now, embodiments of the present invention will be described.

Embodiment 1

Figure 7:
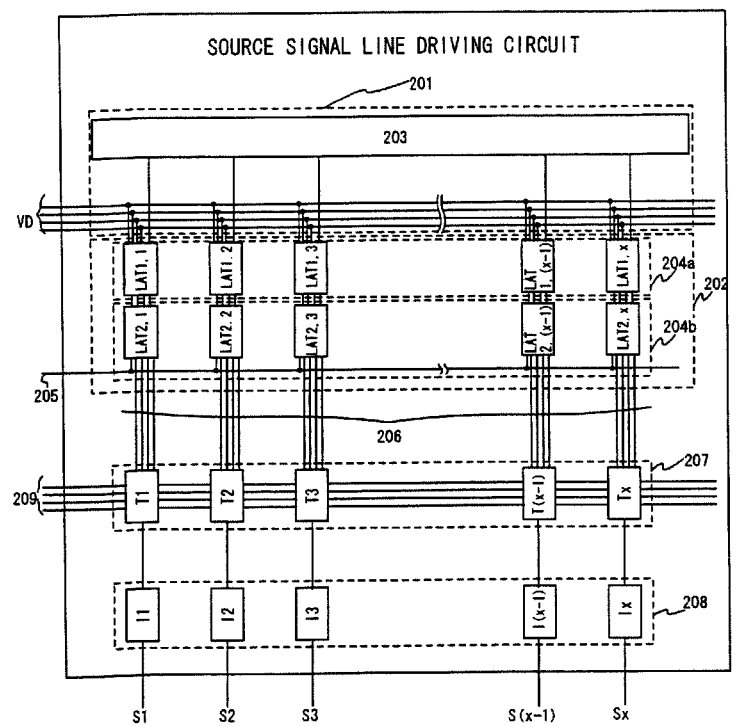
FIG. 7 is a block diagram showing the construction of the source signal line driving circuit of an EL display device embodying the present invention.

FIG. 7 shows the construction and driving method of the source signal line driving circuit of an EL display device embodying the present invention.

This embodiment will be described the source signal line driving circuit which outputs signals to x source signal lines.

A digital signal sampling circuit 201 and a storage circuit 202 are constructed of a shift register 203, a latch circuit 1 (204a) and a latch circuit 2 (204b).

A digital gradation signal VD is inputted to the digital signal sampling circuit 201. Here in this embodiment, the source signal line driving circuit corresponding to the digital gradation signal of 4 bits is mentioned as an example. However, the present invention is not restricted to the example, but it is also applicable to a digital gradation signal of 6 bits, 8 bits or any other bits.

The signals of the digital gradation signal VD sampled by the digital signal sampling circuit 201 are sequentially inputted to the latch circuit 1 (latches LAT1,1-LAT1,*x*). The latch circuit 2 (latches LAT2,1-LAT2,*x*) stores data simultaneously delivered from the latches LAT1,1-LAT1,*x* of the latch circuit 1, on the basis of a latch pulse inputted to a latch pulse line 205. Signal lines 206 supply a lower stage with signals delivered from the latches LAT2,1-LAT2,*x* of the latch circuit 2.

In this embodiment, the digital gradation signal of 4 bits is handled, and hence, the signal lines 206 numbering four are led out of each of the latches LAT2,1-LAT2,*x* of the latch circuit 2.

In general, in case of handling a digital video signal of n bits, the signal lines 206 numbering n are led out of each of the latches LAT2,1-LAT2,*x* of the latch circuit 2.

Incidentally, although symbols are assigned to the signal lines 206 in succession, they shall be omitted from FIG. 7.

Here, the operation of the source signal line driving circuit since the inputting of the digital gradation signal VD till the outputting of the sampled signals from the latches LAT2,1-LAT2,*x* of the latch circuit 2 will be described in detail with note taken of the latches LAT1,1 and LAT2,1 which correspond to outputting to the first source signal line S1.

Figure 8:
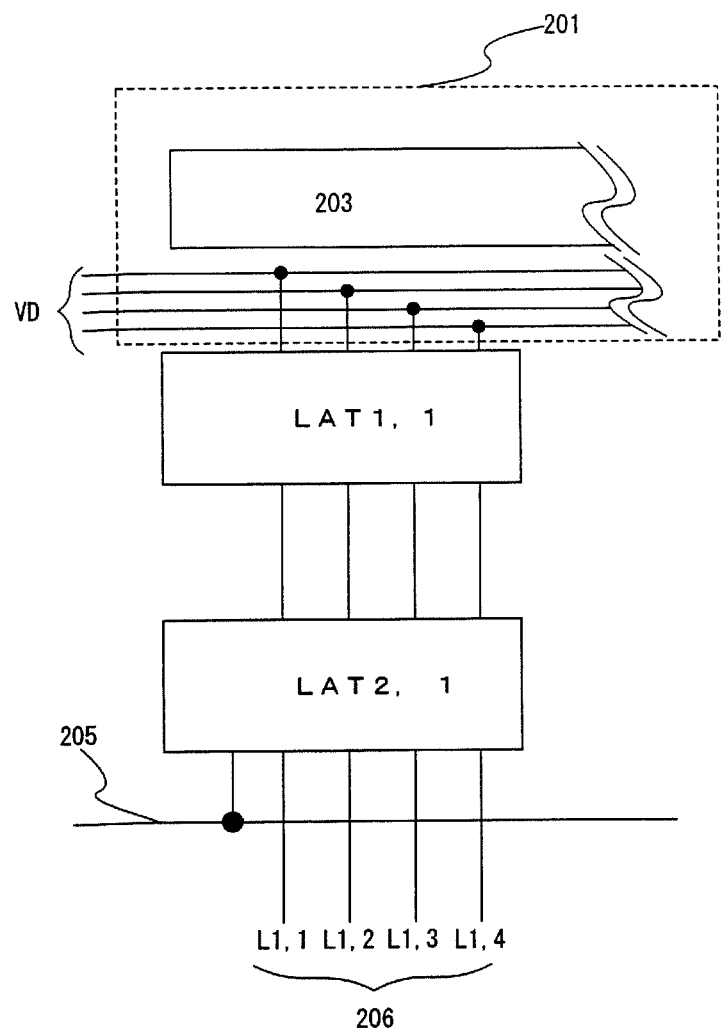
FIG. 8 is a circuit diagram of the source signal line driving circuit of the EL display device embodying the present invention.

FIG. 8 shows the part of the digital signal sampling circuit 201 and the latches LAT1,1 and LAT2,1 for the outputting to the first source signal line S1 in FIG. 7. It is seen that the symbols L1,1-L1,4 are assigned to the signal lines 206. In the symbol "L*a*,*b*" denoting each individual signal line 206, letter a indicates the No. of the latch of the latch circuit 2, and letter b indicates one of the highest bit (numeral "1")-lowest bit (numeral "4").

The sampled bit signals of the digital gradation signal VD sampled by the sampling circuit 201 including the shift register 203 are stored in the latch LAT1,1, and are held in the latch LAT2,1 on the basis of the latch pulse delivered from the latch pulse line 205. The held bit signals are sent to the lower stage through the signal lines L1,1-L1,4.

Likewise, symbols L1,1-L*x*,4 are assigned to all the signal lines 206. Such bit signals are simultaneously delivered to the lower stage from the signal lines L1,1-L*x*,4. When such operations are iterated for all gate signal lines, one frame ends.

Referring to FIG. 7 again, the data outputted from the latches LAT2,1-LAT2,*x* of the latch circuit 2 are inputted to a time setting circuit 207 (constituent circuits T1-T*x*). The signals inputted to the time setting circuit 207 (constituent circuits T1-T*x*) are compared with the signal of a counter signal lines 209 (bit signals) which are also inputted to the time setting circuit 207 (constituent circuits T1-T*x*). Only when both the signals have coincided, signals are sent to a constant current circuit 208 (constant current sources I1-I*x*).

Here, that operation of the source signal line driving circuit in which the data outputted from the latches LAT2,1-LAT2,*x* of the latch circuit 2 are outputted to the time setting circuit will be described in detail with note taken of the constituent circuit T1 which corresponds to the outputting to the first source signal line S1.

Figure 9:
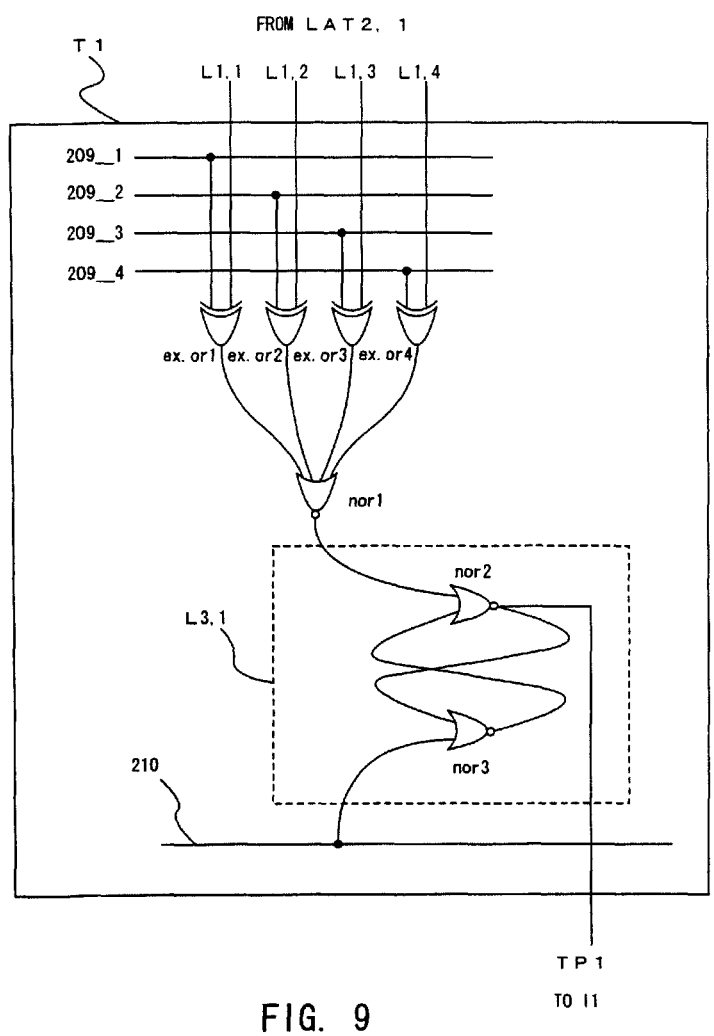
FIG. 9 is a circuit diagram of the source signal line driving circuit of the EL display device embodying the present invention.

FIG. 9 shows the time setting circuit T1 which corresponds to the outputting to the first source signal line S1 in FIG. 7. This circuit T1 comprises the counter signal line (bit lines 209_1-209_4), "ex.or" circuits (ex.or1-ex.or4), "nor" circuits (nor1-nor3), and an initial input line 210.

By the way, in this embodiment, the digital gradation signal of 4 bits is handled, and hence, the counter signal lines 209 consist of the four bit lines 209_1-209_4. In the symbol "209_*a*" denoting each counter bit signal line, letter a indicates one of the highest bit (numeral "1")-lowest bit (numeral "4").

In general, in the case of handling the digital video signal of n bits, the counter bit signal lines number n.

Here, letting m denote the period of the pulse which is outputted to the counter bit signal line 209_1, the pulse which is outputted to the counter bit signal line 209_2 has a period of m/2, the pulse which is outputted to the counter bit signal line 209_3 has a period of m/4, and the pulse which is outputted to the counter bit signal line 209_4 has a period of m/8.

The signals outputted from the latch LAT2,1 to the signal lines L1,1-L1,4 are inputted to the time setting circuit T1. Here, in a case where these signals have respectively coincided with the signals of the counter signal lines 209_1-209_4, that is, in a case where the same signals have been respectively inputted to the ex.or circuits ex.or1-ex.or4, a signal is outputted from the nor circuit nor1 into a latch LAT3.1 which is constructed of the nor circuits nor2 and nor3.

Here, at the beginning of one line period, a signal is inputted to the latch LAT3,1 through the initial input line 210. Owing to the initial input signal, a signal is outputted from the latch LAT3,1 to TP1. Incidentally, the initial input signal is kept outputted until the next signal is inputted to the latch LAT3,1.

Thereafter, when the signal is inputted to the latch LAT3.1 from the nor circuit nor1 by the signals outputted from the LAT2,1, as explained above, the initial input signal is inhibited from being outputted to TP1.

Figure 10:
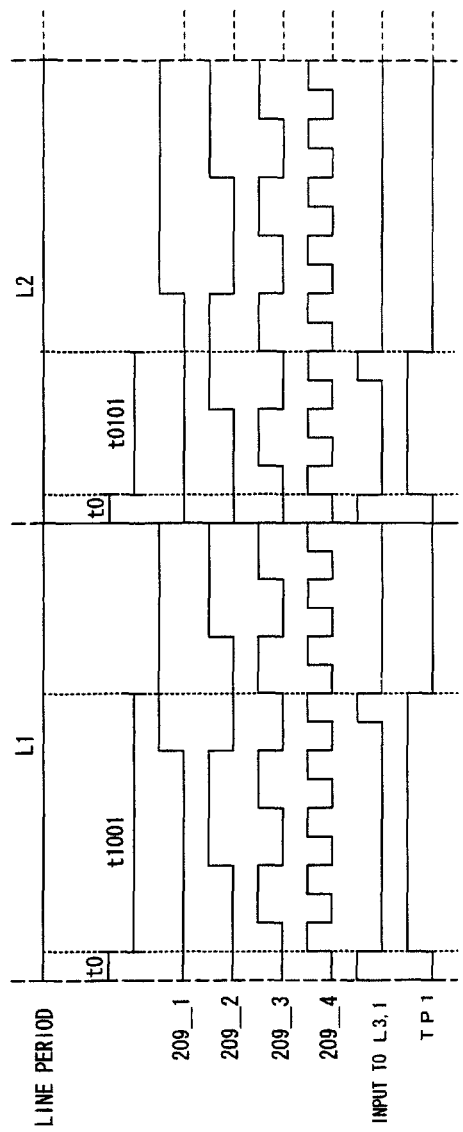
FIG. 10 is a timing chart showing the driving method of the source signal line driving circuit of the EL display device embodying the present invention.

Here, the operation of the time setting circuit T1 will be described with reference to the timing chart of FIG. 10.

There will be exemplified a case where, in the line period L1, signals "1", "0", "0" and "1" have been inputted from the latch LAT2,1 to the time setting circuit T1 through the signal lines L1,1-L1,4 (the signal "0" corresponds to an occasion where no signal is inputted).

During the initial time period t0 of the line period L1, an initial signal is inputted from the initial input line 210 to the latch LAT3.1. Thereafter, a signal is inputted to the latch LAT3,1 again at the time when the signal of the counter signal line 209_1 has coincided with the signal of the signal line L1.1, the signal of the counter signal line 209_2 has coincided with the signal of the signal line L1.2, the signal of the counter signal line 209_3 has coincided with the signal of the signal line L1,3, and the signal of the counter signal line 209_4 has coincided with the signal of the signal line L1,4. In the timing chart, symbol t1001 denotes a time period since the inputting of the initial signal to the latch LAT3,1 at the beginning of the line period L1, till the inputting of the signal of the nor circuit nor1 to the latch LAT3,1. A signal is outputted to TP1 during the time period t1001.

Next, there will be exemplified a case where, in the line period L2, signals "0", "1", "0" and "1" have been inputted from the latch LAT2,1 to the time setting circuit T1 through the signal lines L1,1-L1,4 (the signal "0" corresponds to an occasion where no signal is inputted).

As in the case of the line period L1, during the initial time period t0, an initial signal is inputted from the initial input line 210 to the latch LAT3,1. Thereafter a signal is inputted to the latch LAT3,1 again at the time when the signal of the counter signal line 209_1 has coincided with the signal of the signal line L1.1, the signal of the counter signal line 209_2 has coincided with the signal of the signal line L1,2, the signal of the counter signal line 209_3 has coincided with the signal of the signal line L1,3, and the signal of the counter signal line 209_4 has coincided with the signal of the signal line L1,4. In the timing chart, symbol t0101 denotes a time period since the inputting of the initial signal to the latch LAT3,1 at the beginning of the line period L2, till the inputting of the signal of the nor circuit nor 1 to the latch LAT3,1. A pulse signal is outputted to TP1 during the time period t0101.

Let's compare the line periods L1 and L2 of the timing chart. The ratio between the outputting period t1001 in the line period L1 and the outputting period t0101 in the line period L2 is 9:5. Here, the ratio between values expressed by the O-bit signals "1001" and "0101" respectively inputted in the line periods L1 and L2 is 9:5. That is, the time setting circuit T1 outputs the pulse signals which correspond to the values of the inputted sampled digital gradation signals.

As the inputted sampled digital gradation signal is smaller, the output pulse signal of the time setting circuit in the line period in which this signal has been inputted becomes shorter.

Referring to FIG. 7 again, the operations explained above are simultaneously performed for all the time setting circuits T1-Tx in one line period, and pulse signals of durations corresponding to the inputted signals are outputted.

Such operations are iterated in all the line periods.

The signals outputted from the time setting circuit 207 (constituent circuits T1-Tx) are inputted to the constant current circuit 208 (constant current sources I1-Ix). Currents flow from the constant current sources to the source signal lines (S1-Sx) only for a time period for which the signals are inputted.

Figure 11:
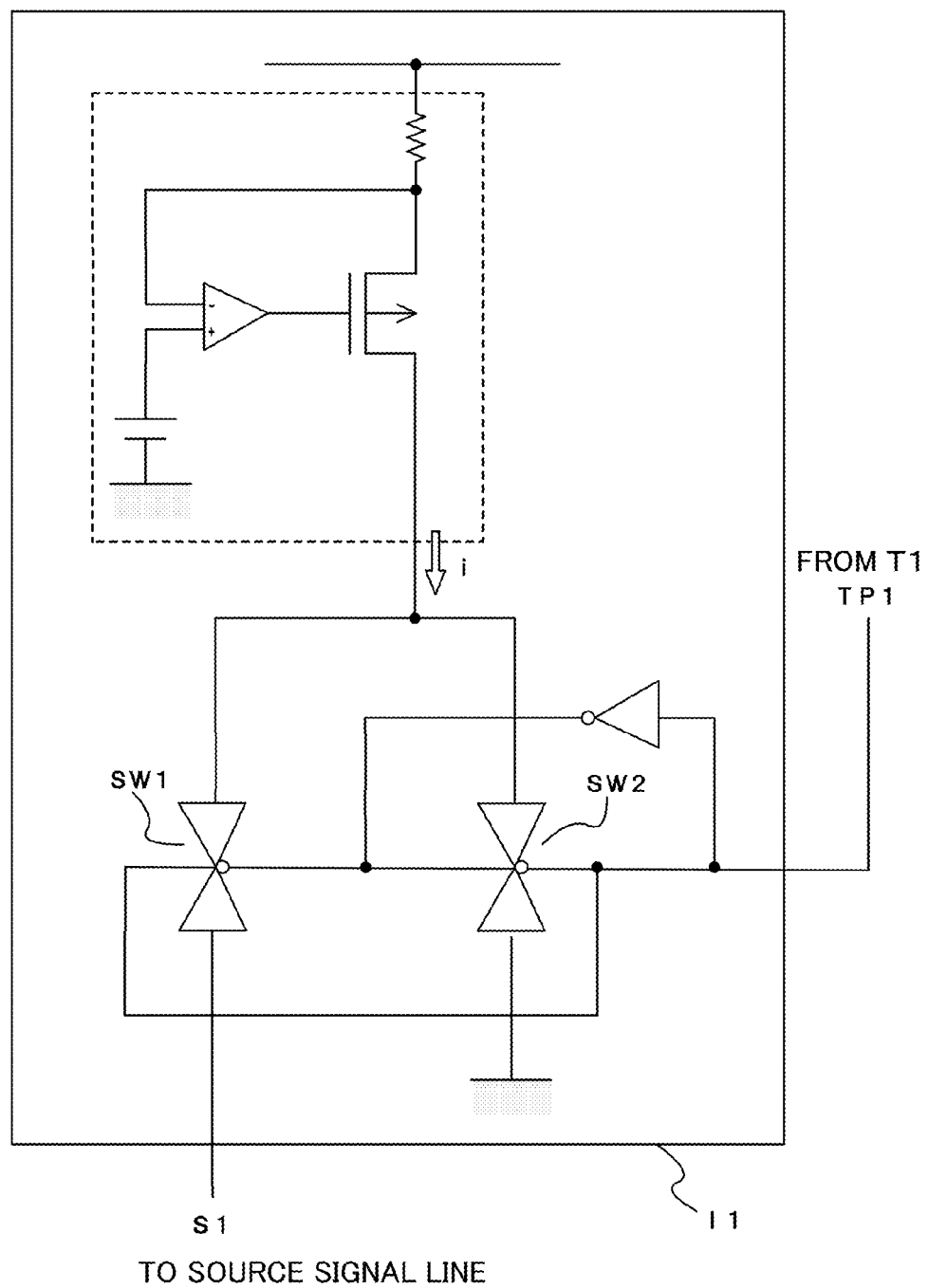
FIG. 11 is a circuit diagram of the source signal line driving circuit of the EL display device embodying the present invention.

That operation of the source signal line driving circuit in which the pulse signals outputted from the time setting circuit 207 (constituent circuits T1-Tx) are inputted to the source signal lines (S1-Sx) through the constant current circuit 208 (constant current sources I1-Ix) will be described in detail with note taken of the constant current source I1 which corresponds to the outputting to the first source signal line S1. FIG. 11 shows the constant current source 11 which corresponds to the outputting to the first source signal line S1 in FIG. 7.

During a time period for which the signal outputted from the time setting circuit T1 is inputted from TP1, a switch SW1 is turned ON, and a switch SW2 is turned OFF, so that a constant current i is inputted from the constant current source to the source signal line S1. Thereafter, when no signal comes to be inputted from TP1, the switch SW1 is turned OFF, and the switch SW2 is turned ON, so that the constant current i no longer flows to the source signal line S1.

Referring to FIG. 7 again, the operations explained above are simultaneously performed for all the constant current sources I1-Ix in one line period, and the constant currents i are outputted during the time period for which the pulse signals are inputted.

Such operations are iterated in all the line periods.

In this manner, the currents are inputted to the source signal lines for the time periods correspondent to the inputted sampled digital gradation signals in the respective pixels, in one line period.

Owing to the above construction, the source signal line driving circuit which outputs the constant currents to the source signal lines for the time periods correspondent to the inputted sampled digital gradation signals is obtained.

Embodiment 2

Figure 13:
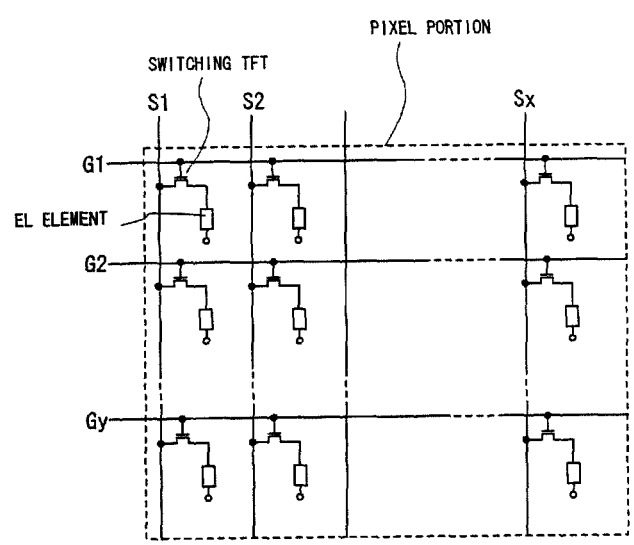
FIG. 13 is a circuit diagram showing the construction of the pixel portion of an EL display device embodying the present invention.

FIG. 13 shows the construction of the pixel portion of an active type EL display device embodying the present invention.

Gate signal lines (G1-Gy) to which selection signals from a gate signal line driving circuit are respectively inputted, are connected to the gate electrodes of switching TFTs included in individual pixels. Besides, either regions of the source regions and drain regions of the switching TFTs included in the individual pixels are connected to source signal lines (S1-Sx) to which currents are respectively inputted, while the other regions are connected to EL elements included in the individual pixels.

By the way, in the present invention, each of the switching TFTs may be either an n-channel TFT or a p-channel TFT.

The driving method of the active type EL display device in this embodiment will be described. When the gate signal line G1 is selected, all the switching TFTs connected thereto have a voltage applied to their gate electrodes and fall into ON states. When currents simultaneously flow from the source signal lines (S1-Sx) to the EL elements through the switching TFTs on this occasion, the EL elements emit light in correspondence with the quantities of the currents.

When similar operations are performed for all the gate signal lines (G1-Gy), one image is displayed.

Embodiment 3

In this embodiment, there will be described a case where the source signal line driving circuit of Embodiment 1 is employed for the active type EL display device of Embodiment 2.

That is, there will be described a case where the source signal line driving circuit as explained in Embodiment 1, which outputs the constant currents to the source signal lines for the time periods corresponding to the inputted sampled digital gradation signals, is applied to the active type EL display device as explained in Embodiment 2, in which each pixel is constructed of one TFT and one EL element.

The current to be inputted to each of the source signal lines of the active type EL display device of Embodiment 2 is generated by the source signal line driving circuit explained in Embodiment 1.

As explained before, the current which is outputted from the source signal line driving circuit according to the present invention is the current pulse having the duration which corresponds to the sampled signal of the digital gradation signal externally inputted. The pixel connected to the selected gate signal line emits light only for the time period during which the current pulse is inputted to the source signal line so as to flow to the EL element through the switching TFT.

The quantity of light emission of the EL element in each pixel of the active type EL display device explained in Embodiment 2 is controlled by the time period of the light emission, and a gradation is expressed.

Here in this specification, the technique of expressing the gradation in such a way that the quantity of light emission of the EL element is controlled by controlling the light emission period thereof shall be called the "time-based gradation method".

Embodiment 4

In this embodiment, there will be described a case where the source signal line driving circuit of Embodiment 1 is employed for a passive type EL display device.

The first object of the present invention can be accomplished by applying the source signal line driving circuit of Embodiment 1 to the signal line driving circuit in FIG. 2.

A current to be inputted to each of the signal lines of the passive type EL display device is generated by the source signal line driving circuit explained in Embodiment 1.

As explained before, the current which is outputted from the source signal line driving circuit according to the present invention is the current pulse having the duration which corresponds to the sampled signal of the digital gradation signal externally inputted.

The pixel connected to the selected scanning line emits light only for the time period during which the current pulse is inputted to the signal line so as to flow to the EL element.

The quantity of light emission of the EL element in each pixel of the passive type EL display device is controlled by the time period of the light emission, and a gradation is expressed. The EL element is driven by such a time-based gradation method.

Figure 23A:
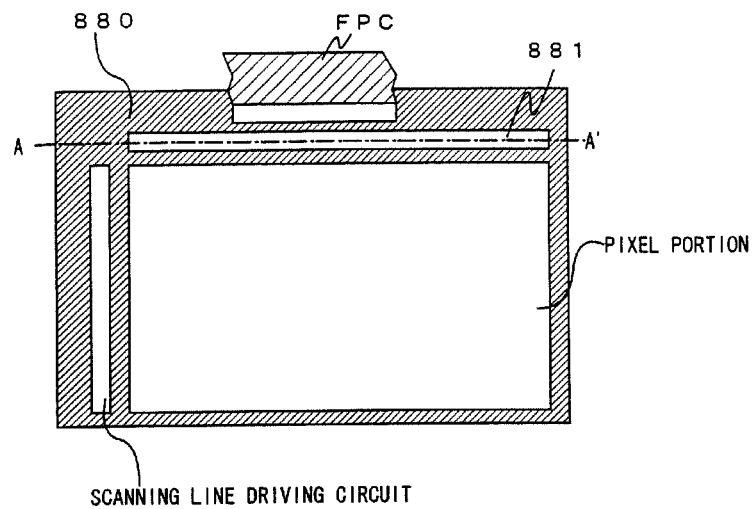
FIGS. 23A and 23B are a top plan view and a vertical sectional view of the pixel portion of an EL display device embodying the present invention, respectively.
Figure 23B:
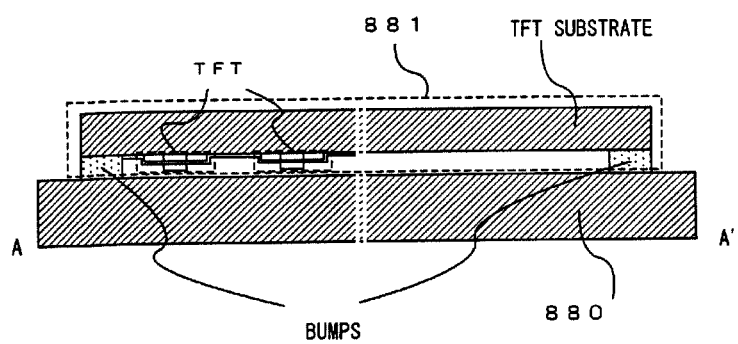

The passive type EL display device in this embodiment is shown in FIGS. 23A and 23B.

FIG. 23A is a top plan view. FIG. 23B is a vertical sectional view taken along line A-A' indicated in FIG. 23A.

Referring to FIG. 23A, the passive type EL display device includes an insulating substrate 880, an FPC (flexible printed circuit), a scanning line driving circuit, a signal line driving circuit 881, and a pixel portion.

Referring to FIG. 23B, the signal line driving circuit 881 is constructed of TFTs which are formed on a TFT substrate.

The signal line driving circuit 881 formed of the TFTs is bonded onto the insulating substrate 880.

Herein, the signal line driving circuit 881 is bonded onto the insulating substrate 880 through bumps as shown in FIG. 23B.

Embodiment 5

In this embodiment, an example in which an active EL display device is fabricated by using the present invention will be described.

Figure 17A:
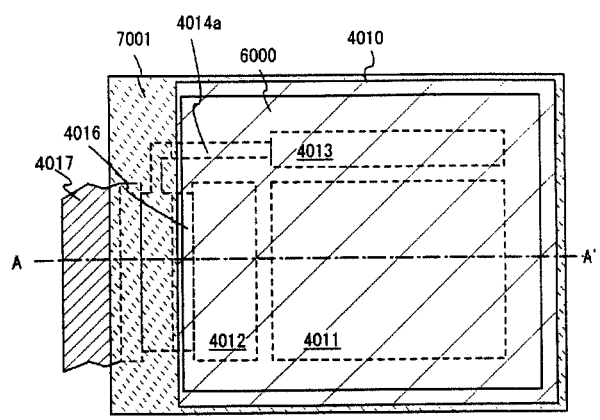
FIGS. 17A and 17B are a top plan view and a vertical sectional view of the pixel portion of an EL display device embodying the present invention, respectively.

FIG. 17A is a top view of an active EL display device using the present invention. In FIG. 17A, reference numeral 4010 designates a substrate; 4011, a pixel portion; 4012, a source signal line driving circuit; and 4013, a gate signal line driving circuit, and the respective driving circuits lead to an FPC 4017 through wirings 4014 to 4016 and are connected to an external equipment.

At this time, a cover member 6000, a seal member (also called a housing member) 7000, and a sealant (second seal member) 7001 are provided so as to surround at least the pixel portion, preferably the driving circuits and the pixel portion.

Figure 17B:
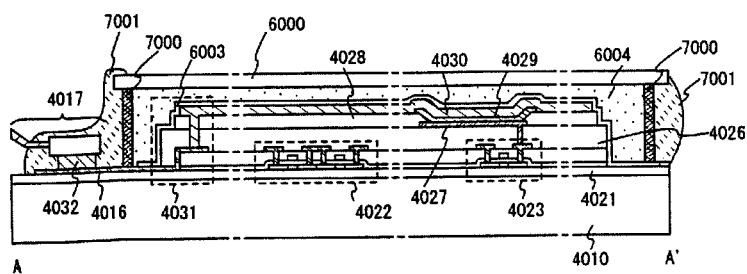

FIG. 17B is a view showing a sectional structure of the EL display device of this embodiment. A driving circuit TFT (here, a CMOS circuit of a combination of an n-channel TFT and a p-channel TFT is shown) 4022 and a pixel portion TFT 4023 are formed on the substrate 4010 and a film 4021. These TFTs may be formed by using a well-known structure (top gate structure or bottom gate structure).

When the driving circuit TFT 4022 and the pixel portion TFT 4023 are completed, a pixel electrode 4027 electrically connected to a drain of the pixel portion TFT 4023 and made of a transparent conductive film is formed on an interlayer insulating film (flattening film) 4026 made of resin material.

As the transparent conductive film, a compound (called ITO) of indium oxide and tin oxide or a compound of indium oxide and zinc oxide can be used. After the pixel electrode 4027 is formed, an insulating film 4028 is formed, and an opening portion is formed on the pixel electrode 4027.

Next, an EL layer 4029 is formed. As the EL layer 4029, a laminate structure or a single layer structure may be adopted by freely combining well-known EL materials (hole injecting layer, hole transporting layer, light emitting layer, electron transporting layer, and electron injecting layer). A well-known technique may be used to determine the structure. The EL material includes a low molecular material and a high molecular (polymer) material. In the case where the low molecular material is used, an evaporation method is used. In the case where the high molecular material is used, it is possible to use a simple method such as a spin coating method, a printing method or an ink jet method.

In this embodiment, the EL layer is formed by the evaporation method using a shadow mask. Color display becomes possible by forming light emitting layers (red light emitting layer, green light emitting layer, and blue light emitting layer), which can emit lights with different wavelengths, for every pixel by using the shadow mask. In addition, there are a system in which a color conversion layer (CCM) and a color filter are combined, and a system in which a white light emitting layer and a color filter are combined, and either system may be used. Of course, an EL display device of monochromatic light emission may be used.

After the EL layer 4029 is formed, a cathode 4030 is formed thereon. It is desirable to remove moisture and oxygen existing in the interface between the cathode 4030 and the EL layer 4029 to the utmost. Thus, it is necessary to make such contrivance that the EL layer 4029 and the cathode 4030 are continuously formed in vacuum, or the EL layer 4029 is formed in an inert gas atmosphere and the cathode 4030 is formed without releasing to the atmosphere. In this embodiment, a film formation apparatus of a multi-chamber system (cluster tool system) is used, so that the foregoing film formation is made possible.

Incidentally, in this embodiment, a laminate structure of a LiF (lithium fluoride) film and an Al (aluminum) film is used for the cathode 4030. Specifically, the LiF (lithium fluoride) film having a thickness of 1 nm is formed on the EL layer 4029 by the evaporation method, and the aluminum film having a thickness of 300 nm is formed thereon. Of course, a MgAg electrode of a well-known cathode material may be used. The cathode 4030 is connected to the wiring 4016 in a region designated by 4031. The wiring 4016 is a power supply line for giving a predetermined voltage to the cathode 4030, and is connected to the FPC 4017 through a conductive paste material 4032.

For the purpose of electrically connecting the cathode 4030 to the wiring 4016 in the region 4031, it is necessary to form contact holes in the interlayer insulating film 4026 and the insulating film 4028. These may be formed at the time of etching the interlayer insulating film 4026 (at the time of forming the contact hole for the pixel electrode) and at the time of etching the insulating film 4028 (at the time of forming the opening portion before formation of the EL layer). When the insulating film 4028 is etched, the interlayer insulating film 4026 may be etched together. In this case, if the interlayer insulating film 4026 and the insulating film 4028 are made of the same resin material, the shape of the contact hole can be made excellent.

A passivation film 6003, a filler 6004, and a cover member 6000 are formed to cover the surface of the EL element formed in this way.

Further, the seal member 7000 is provided at the inside of the cover member 6000 and the substrate 4010 in such a manner as to cover the EL element portion, and further, the sealant (second seal member) 7001 is formed at the outside of the seal member 7000.

At this time, this filler 6004 functions also as an adhesive for bonding the cover member 6000. As the filler 6004, PVC (polyvinylchloride), epoxy resin, silicone resin. PVB (polyvinyl butyral) or EVA (ethylene-vinyl acetate) can be used. It is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet of a structure in which an aluminum foil of several tens of mm is put between PVF films or Mylar films.

However, according to the direction of light emission (radiation direction of light) from the EL element, it is necessary that the cover member 6000 has transparency.

The wiring 4016 is electrically connected to the FPC 4017 through the gap between the substrate 4010 and the seal member 7000 or the sealant 7001. Incidentally, here, although the description has been made on the wiring line 4016, the other wiring lines 4014 and 4015 are also electrically connected to the FPC 4017 through a space under the seal member 7000 and the sealant 7001 in the same way.

Note that the cover member 6000 is bonded after forming the filling material 6004 and that the sealing material 7000 is attached so as to cover the side surface (exposed surface) of the filling material 6004 in Embodiment 5, but the filling material 6004 may also be formed after attaching the cover member 6000 and the sealing material 7000. In this case, a filling material injection port passing through the gap formed by the substrate 4010, the cover member 6000 and the sealing material 7000 is formed. The gap is then placed in a vacuum state (equal to or less than $10^{-2}$ Torr), and after immersing the injection port in a tank containing the filling material, the pressure on the outside of the gap is made higher than the pressure within the gap, and the filling material fills the space.

Embodiment 6

In this embodiment, an example in which an EL display device different from Embodiment 5 is fabricated by using the present invention will be described with reference to FIGS. 18A and 18B. Since the same reference numerals as those of FIGS. 17A and 17B designate the same portions, the explanation is omitted.

Figure 18A:
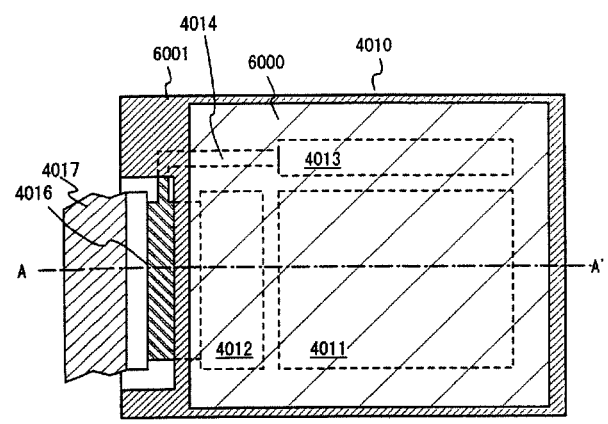
FIGS. 18A and 18B are a top plan view and a vertical sectional view of the pixel portion of an EL display device embodying the present invention, respectively.
Figure 18B:
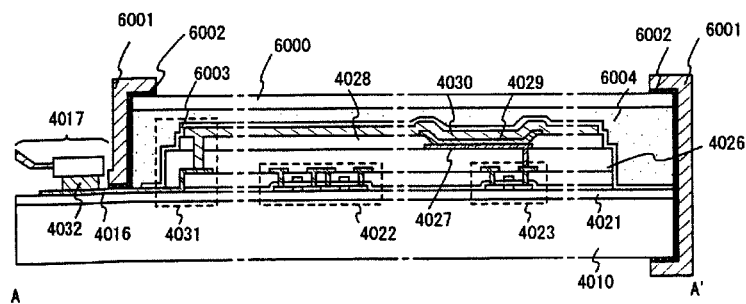

FIG. 18A is a top view of an EL display device of this embodiment, and FIG. 18A is a sectional view taken along line A-A' of FIG. 18A.

In accordance with Embodiment 5, steps are carried out until a passivation film 6003 covering the surface of an EL element is formed.

Further, a filler 6004 is provided so as to cover the EL element. This filler 6004 functions also as an adhesive for bonding a cover member 6000. As the filler 6004, PVC (polyvinyl chloride), epoxy resin, silicone resin, PVB (polyvinyl butyral) or EVA (ethylene-vinyl acetate) can be used.

Also, it is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet of a structure in which an aluminum foil of several tens of mm is put between PVF films or Mylar films.

However, according to the direction of light emission (radiation direction of light) from the EL element, it is necessary that the cover member 6000 has transparency.

Next, after the cover member 6000 is bonded by using the filler 6004, a frame member 6001 is attached so as to cover the side (exposed surface) of the filler 6004. The frame member 6001 is bonded by a seal member (functioning as an adhesive) 6002. At this time, as the seal member 6002, although it is preferable to use a photo-curing resin, if heat resistance of the EL layer permits, a thermosetting resin may be used. Incidentally, it is desirable that the seal member 6002 is a material which is as impermeable as possible to moisture and oxygen. A drying agent may be added in the inside of the seal member 6002.

A wiring line 4016 is electrically connected to an FPC 4017 through a gap between the seal member 6002 and a substrate 4010. Here, although description has been made on the wiring 4016, other wiring 4014 is also electrically connected to the FPC 4017 through a gap between the seal member 6002 and the substrate 4010 in the same manner.

Note that the cover member 6000 is bonded after forming the filling material 6004 and that the frame material 6001 is attached so as to cover the side surface (exposed surface) of the filling material 6004 in Embodiment 6, but the filling material 6004 may also be formed after attaching the cover member 6000 and the frame material 6001. In this case, a filling material injection port passing through the gap formed by the substrate 4010, the cover member 6000 and the frame material 6001 is formed. The gap is then placed in a vacuum state (equal to or less than $10^{-2}$ Torr), and after immersing the injection port in a tank containing the filling material, the pressure on the outside of the gap is made higher than the pressure within the gap, and the filling material fills the space.

Embodiment 7

Figure 19:
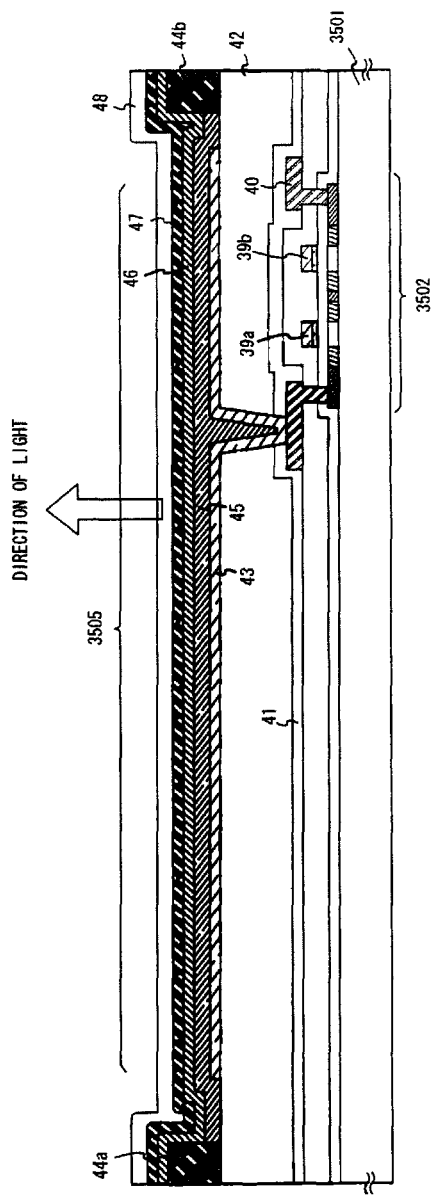
FIG. 19 is a sectional view of the pixel portion of an EL display device embodying the present invention.

Here, a more detailed sectional structure of a pixel portion of an EL display device is shown in FIG. 19. In FIG. 19, a switching TFT 3502 provided on a substrate 3501 is formed by using an n-channel TFT formed by a known method. In this embodiment, a double gate structure in which two gate electrodes 39a and 39b is used. The two gate electrodes 39a and 39b are electrically connected to each other herein. There is a merit that an off current value can be decreased because a structure in which two TFTs are substantially connected in series with each other is obtained by adopting the double gate structure. Incidentally, although the double gate structure is adopted in this embodiment, a single gate structure may be adopted, or a triple gate structure or a multi-gate structure having more gates may be adopted. Further, it may be formed by using a p-channel TFT formed by a known method.

A first passivation film 41 is provided on the switching TFT 3502 and a flattening film 42 made of a resin insulating film is formed thereon. It is very important to flatten a stepped portion due to the TFT by using the flattening film 42. Since an EL layer formed later is very thin, there is a case where light emission defect occurs due to the existence of the stepped portion. Thus, it is desirable to conduct flattening prior to formation of a pixel electrode so that the EL layer can be formed on the flat surface.

Reference numeral 43 designates a pixel electrode (cathode of the EL element in this case) made of a conductive film having high reflectivity, and is electrically connected to the drain region of the switching TFT 3502. As the pixel electrode 43, it is preferable to use a low resistance conductive film, such as an aluminum alloy film, a copper alloy film or a silver alloy film, or a lamination film of those. Of course, a laminate structure with another conductive film may be adopted.

A light emitting layer 45 is formed in a groove (corresponding to a pixel) formed by banks 44a and 44b formed of an insulating film (preferably resin). Herein, only one pixel is shown, however, light emitting layers corresponding to each color of R (red). G (green), and B (blue) may be formed. As an organic EL material used for the light emitting layer, a p-conjugate polymer material is used. Typical examples of the polymer material include polyparaphenylene vinylene (PPV), polyvinyl carbazole (PVK), and polyfluorene.

Although various types exist as the PPV typed organic EL material, for example, a material as disclosed in "H. Shenk, H. Becker, O Goledsen, E. Kluge. W. Kreuder, and H. Spreitzer, "Polymers for Light Emitting Diodes", Euro Display. Proceedings, 1999. p. 33-37" or Japanese Patent Application Laid-open No. Hei. 10-92576 may be used.

As a specific light emitting layer, it is appropriate that cyanopolyphenylene-vinylene is used for a light emitting layer emitting red light, polyphenylenevinylene is used for a light emitting layer emitting green light, and polyphenylenevinylene or polyalkylphenylene is used for a light emitting layer emitting blue light. It is appropriate that the film thickness is made 30 to 150 nm (preferably 40 to 100 nm).

However, the above examples are an example of the organic EL material which can be used for the light emitting layer, and it is not necessary to limit the invention to these. The EL layer (layer in which light emission and movement of carriers for that are performed) may be formed by freely combining a light emitting layer, a charge transporting layer and a charge injecting layer.

For example, although this embodiment shows the example in which the polymer material is used for the light emitting layer, a low molecular organic EL material may be used. It is also possible to use an inorganic material, such as silicon carbide, as the charge transporting layer or the charge injecting layer. As the organic EL material or inorganic material, a well-known material can be used.

This embodiment adopts the EL layer having a lamination structure in which a hole injecting layer 46 made of PEDOT (polythiophene) or PAni (polyaniline) is provided on the light emitting layer 45. An anode 47 made of a transparent conductive film is provided on the hole injecting layer 46. In the case of this embodiment, since light generated in the light emitting layer 45 is radiated to an upper surface side (to the upper side of the TFT), the anode must be translucent. As the transparent conductive film, a compound of indium oxide and tin oxide or a compound of indium oxide and zinc oxide can be used. However, since the film is formed after the light emitting layer and the hole injecting layer having low heat resistance is formed, it is preferable that film formation can be made at the lowest possible temperature.

At the point when the anode 47 was formed, an EL element 3505 is completed. Incidentally, the EL element 3505 here indicates a capacitor formed of the pixel electrode (cathode) 43, the light emitting layer 45, the hole injecting layer 46 and the anode 47. Since the pixel electrode 43 is almost coincident with the area of the pixel, the whole pixel functions as the EL element. Thus, use efficiency of light emission is very high, and bright image display becomes possible.

In this embodiment, a second passivation film 48 is further provided on the anode 47. As the second passivation film 48, a silicon nitride film or a silicon nitride oxide film is desirable. This object is to insulate the EL element from the outside, and has both meaning of preventing deterioration due to oxidation of the organic material and suppressing degassing from the organic EL material. By doing this, the reliability of the EL display device is improved.

As described above, the EL display of the present invention includes the pixel portion comprising the pixel having the structure as shown in FIG. 19, and includes the switching TFT having a sufficiently low off current value. Thus, it is possible to obtain the EL display which has high reliability and can make excellent image display.

Embodiment 8

Figure 20:
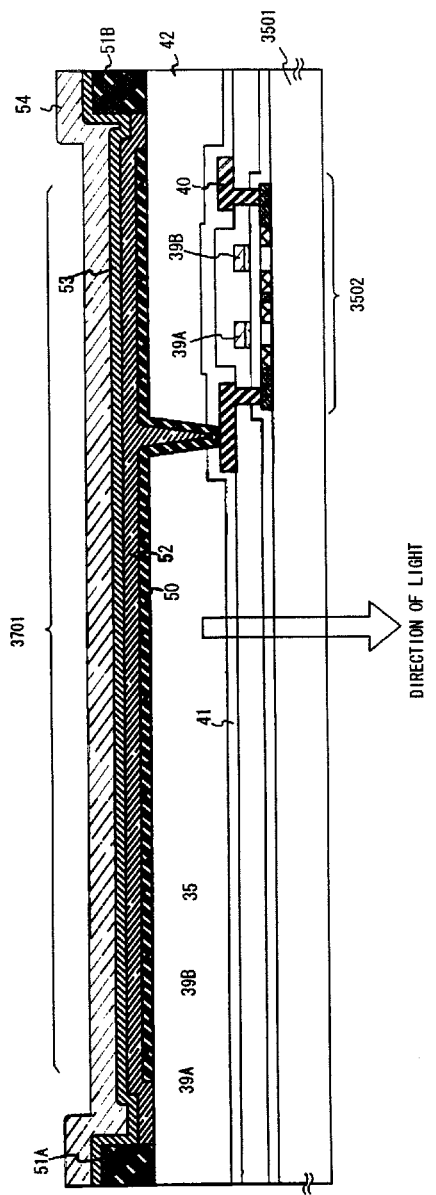
FIG. 20 is a sectional view of the pixel portion of an EL display device embodying the present invention.

In this embodiment, a description will be made on a structure in which the structure of the EL element 3505 is inverted in the pixel portion shown in Embodiment 7. FIG. 20 is used for the description. Incidentally, points different from the structure of FIG. 19 are only a portion of an EL element and a switching TFT, the other explanation is omitted.

In FIG. 20, a switching TFT 3502 is formed by using a p-channel TFT formed by a known method.

In this embodiment, a transparent conductive film is used as a pixel electrode (anode) 50. Specifically, a conductive film made of a compound of indium oxide and zinc oxide is used. Of course, a conductive film made of a compound of indium oxide and tin oxide may be used.

After banks 51a and 51b made of insulating films are formed, a light emitting layer 52 made of polyvinylcarbazole is formed by solution application. An electron injecting layer 53 made of potassium acetylacetonate (expressed as acacK), and a cathode 54 made of aluminum alloy are formed thereon. In this case, the cathode 54 functions also as a passivation film. In this way, an EL element 3701 is formed.

In Embodiment 8, light generated in the light emitting layer 52 is radiated to the substrate on which TFTs are formed as indicated by an arrow.

Embodiment 9

In Embodiment 9, a method of manufacturing TFTs of a pixel portion and a driving circuit portion (source signal line driving circuit and gate signal line driving circuit) formed in the periphery thereof in an active EL display device of the present invention simultaneously is explained. Note that a CMOS circuit which is a base unit is illustrated as the driving circuit portion to make a brief explanation.

First, as shown in FIG. 14A, a base film 5002 made from an insulating film such as a silicon oxide film, a silicon nitride film, or a silicon nitride oxide film is formed on a substrate 5001 made from glass such as barium borosilicate glass or aluminum borosilicate glass, typically Corning Corp. #7059 glass or #1737 glass. For example, a silicon nitride oxide film 5002a made from $SiH_4$, $NH_3$, and $N_2O$ by plasma CVD is formed with a thickness of 10 to 200 nm (preferably from 50 to 100 nm), and a hydrogenized silicon nitride oxide film

5002*b* with a thickness of 50 to 200 nm (preferably between 100 and 150 nm), made from $SiH_4$ and $N_2O$, is similarly formed and laminated. The base film 5002 is shown as a two layer structure in Embodiment 9, but it may also be formed as a single layer of the above insulating films, and it may also be formed having a lamination structure in which two layers or more are laminated.

Island shape semiconductor layers 5003 to 5005 are formed by a crystalline semiconductor film manufactured using a laser crystallization method of a semiconductor film having an amorphous structure, or using a known thermal crystallization method. The thickness of the island-shape semiconductor layers 5003 to 5005 is formed to a thickness of 25 to 80 nm (preferably between 30 and 60 nm). There are no limitations in the crystalline semiconductor film material, but it is preferable to form the film from a silicon or a silicon germanium (SiGe) alloy.

A laser such as a pulse emission type or continuous emission type excimer laser, a YAG laser, and a $YVO_4$ laser can be used in the laser crystallization method to manufacture a crystalline semiconductor film. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse emission frequency is set to 30 Hz, and the laser energy density is set from 100 to 400 $mJ/cm^2$ (typically between 200 and 300 $mJ/cm^2$). Further, the second harmonic is utilized when using the YAG laser, the pulse emission frequency is set from 1 to 10 KHz, and the laser energy density may be set from 300 to 600 $mJ/cm^2$ (typically between 350 and 500 $mJ/cm^2$). The laser light collected into a linear shape with a width of 100 to 1000 mm, for example 400 mm, is then irradiated over the entire surface of the substrate. This is performed with an overlap ratio of 80 to 98% for the linear shape laser light.

A gate insulating film 5007 is formed covering the semiconductor layers 5003 to 5005. A gate insulating film 5007 is formed by an insulating film containing silicon with a thickness of 40 to 150 nm by plasma CVD or sputtering. A 120 nm thick silicon nitride oxide film is formed in Embodiment 9. The gate insulating film is not limited to this type of silicon nitride oxide film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C. of the silicon oxide film thus manufactured.

A first conductive film 5008 and a second conductive film 5009 are then formed on the gate insulating film 5007 in order to form gate electrodes. The first conductive film 5008 is formed from Ta (tantalum) with a thickness of 50 to 100 nm, and the second conductive film 5009 is formed from W (tungsten) having a thickness of 100 to 300 nm, in Embodiment 9.

The Ta film is formed by sputtering of a Ta target by Ar. If appropriate amounts of Xe and Kr are added to Ar at the time of sputtering, the internal stress of the Ta film is relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. An α phase Ta film can easily be obtained if a tantalum nitride film, which possesses a crystal structure near that of α phase Ta, is formed with a thickness of about 10 to 50 nm as a base for Ta in order to form α phase Ta.

The W film is formed by sputtering with a W target, which can also be formed by thermal CVD using tungsten hexafluoride ($WF_6$). Whichever is used, it is necessary to be able to make the film become low resistance in order to use it as the gate electrode, and it is preferable that the resistivity of the W film be made equal to or less than 20 μΩcm. The resistivity can be lowered by enlarging the crystal grains of the W film, but for cases in which there are many impurity elements such as oxygen in the W film, crystallization is inhibited, and the film becomes high resistance. A W target having a purity of 99.9999% is thus used in sputtering. In addition, by forming the W film while taking sufficient care that no impurities from within the gas phase are introduced at the time of film formation, a resistivity of 9 to 20 μΩcm can be achieved.

Note that, although the first conductive film 5008 is Ta and the second conductive film 5009 is W in Embodiment 9, the conductive films are not limited to these, and both may also be formed from an element selected from the group consisting of Ta, W, Ti, Mo. Al, and Cu, or from an alloy material having one of these elements as its main component, or from a chemical compound of these elements. Further, a semiconductor film, typically a polysilicon film into which an impurity element such as phosphorous is doped, may also be used. Examples of preferable combinations other than that used in Embodiment 9 include: forming the first conductive film 5008 by tantalum nitride (TaN) and combining it with the second conductive film 5009 formed from W; forming the first conductive film 5008 by tantalum nitride (TaN) and combining it with the second conductive film 5009 formed from Al; and forming the first conductive film 5008 by tantalum nitride (TaN) and combining it with the second conductive film 5009 formed from Cu.

Then, a mask 5010 is formed from resist, and a first etching process is performed in order to form electrodes and wirings. An ICP (inductively coupled plasma) etching method is used in Embodiment 9. A gas mixture of $CF_4$ and $Cl_2$ is used as an etching gas, and a plasma is generated by applying a 500 W RF electric power (13.56 MHz) to a coil shape electrode at a pressure of 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are combined.

The edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. In this way, the first shape conductive layers 5011 to 5014 are thus formed from the first conductive layers and the second conductive layers (the first conductive layers 5011*a* to 5014*a* and the second conductive layers 5011*b* to 5014*b*) in accordance with the first etching process. At this to time, regions of the gate insulating film 5007 not covered by first shape conductive layers 5011 to 5014 are made thinner by about 20 to 50 nm.

A first doping process is then performed, and an impurity element which imparts n-type conductivity is added. The doping can be carried out by ion doping or ion implantation. Ion doping is performed under conditions of a dose amount from $1 \times 10^{13}$ to $5 \times 10^{14}$ atoms/cm$^2$ and an acceleration voltage of 60 to 100 keV. An element in periodic table group 15, typically phosphorous (P) or arsenic (As) is used as the impurity element which imparts n-type conductivity, and phosphorous (P) is used here. The conductive layers 5011 to 5014 become masks with respect to the n-type conductivity imparting impurity element in this case, and the first impurity regions 5017 to 5023 are formed in a self-aligning manner. The impurity element which imparts n-type conductivity is added to the first impurity regions 5017 to 5023 at a concentration in the range of $1 \times 10^{20}$ to $1 \times 10^{21}$ atoms/cm$^3$. (FIG. 14B)

Next, as shown in FIG. 14C, a second etching process is performed without removing the resist mask. The etching gas of the mixture of CF$_4$, Cl$_2$, and O$_2$, is used, and the W film is selectively etched. At this point, second shape conductive layers 5026 to 5029 (first conductive layers 5026*a* to 5029*a* and second conductive layers 5026*b* to 5029*b*) are formed by the second etching process. Regions of the gate insulating film 5007, which are not covered with the second shape conductive layers 5026 to 5029 are made thinner by about 20 to 50 nm by etching.

An etching reaction of the W film or the Ta film by the mixture gas of CF$_4$ and Cl$_2$ can be guessed from a generated radical or ion species and the vapor pressure of a reaction product. When the vapor pressures of fluoride and chloride of W and Ta are compared with each other, the vapor pressure of WF$_6$ of fluoride of W is extremely high, and other WCl$_5$, TaF$_5$, and TaCl$_5$ have almost equal vapor pressures. Thus, in the mixture gas of CF$_4$ and Cl$_2$, both the W film and the Ta film are etched. However, when a suitable amount of O$_2$ is added to this mixture gas, CF$_4$ and O$_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of O$_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 15A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1 \times 10^{13}$ atoms/cm$^2$, so that new impurity regions are formed inside of the first impurity regions formed into the island-shape semiconductor layers in FIG. 14B. Doping is carried out such that the second shape conductive layers 5026 to 5029 are used as masks to the impurity element and the impurity element is added also to the regions under the first conductive layers 5026*a* to 5029*a*. In this way, third impurity regions 5032 to 5035 are formed. The concentration of phosphorous (P) added to the third impurity regions 5032 to 5035 has a gentle concentration gradient in accordance with the thickness of tapered portions of the first conductive layers 5026*a* to 5029*a*. Note that in the semiconductor layer that overlap with the tapered portions of the first conductive layers 5026*a* to 5029*a*, the impurity concentration slightly falls from the end portions of the tapered portions of the first conductive layers 5026*a* to 5029*a* toward the inner portions, but the concentration keeps almost the same level.

As shown in FIG. 15B, a third etching process is performed using the etching gas of CHF$_6$, and a reactive ion etching (RIE method) is used. By the third etching process, the tapered portion of the first conductive layers 5026*a* to 5029*a* are partly etched to contract the overlapping region of the first conductive layers with a semiconductor layer. Third shape conductive layers 5037 to 5040 (first conductive layers 5037*a* to 5040*a* and second conductive layers 5037*b* to 5040*b*) are formed by the third etching process. Regions of the gate insulating film 5007, which are not covered with the third shape conductive layers 5037 to 5040 are made thinner by about 20 to 50 nm by etching.

By the third etching process, third impurity regions 5032*a* to 5035*a* that overlap with the first conductive layers 5037*a* to 5040*a* and second impurity regions 5032*b* to 5035*b* between the first impurity region and the third impurity region, are formed in the third impurity regions 5032 to 5035.

Fourth impurity regions 5043 to 5048 having a conductivity type which is the opposite of the first conductive type, are then formed as shown in FIG. 15C in the island shape semiconductor layer 5004 which forms p-channel TFTs. The third shape conductive layer 5038*b* is used as a mask with respect to the impurity element, and the impurity regions are formed in a self-aligning manner. The island shape semiconductor layers 5003 and 5005, which form n-channel TFTs, are covered over their entire surface areas by resist masks 5200. Phosphorous is added in differing concentration to the impurity regions 5043 to 5048, and ion doping is performed here using diborane (B$_2$H$_6$), so that the impurity concentration in the regions becomes from $2 \times 10^{20}$ to $2 \times 10^{21}$ atoms/cm$^3$.

Impurity regions are formed in the respective island shape semiconductor layers by the above processes. The third shape conductive layers 5037 to 5040 overlapping the island shape semiconductor layers function as gate electrodes.

After removing the resist masks 5200, a process of activating the impurity elements added to the respective island shape semiconductor layers is then performed with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 9. However, for cases in which the wiring material used in the third shape conductive layers 5037 to 5040 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

Figure 16A:
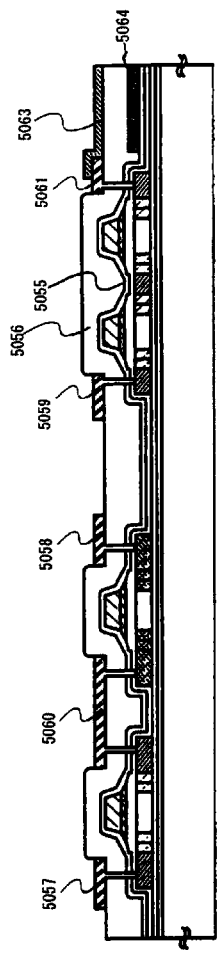
FIGS. 16A and 16B are sectional views showing the manufacturing steps of the EL display device embodying the present invention.

Then, a first interlayer insulating film 5055 is formed of a silicon nitride oxide film having a thickness of 100 to 200 nm as shown in FIG. 16A. On the first interlayer insulating film, a color filter (R) or a color filter (G) or a color filter (B) is patterned with respect to respective pixels. In FIG. 16, reference numeral 5064 shows a color filter. Here, the "color filter (R)" is a color filter which extracts red light from white light, the "color filter (G)" is a color filter which extracts green light from the white light, and the "color filter (B)" is a color filter which extracts blue light from the white light. Further, after a second interlayer insulating film 5056 made of an organic insulating material is formed thereon, contact holes are formed in the first interlayer insulating film 5055, the second interlayer insulating film 5056, and the gate insulting film 5007. After forming each wiring 5057 to 5061 by patterning, a pixel electrode 5063 contacting the wiring 5061 is formed by patterning.

An organic resin material is used for the second interlayer insulating film 5056. Organic resins such as polyimide, polyamide, acrylic, and BCB (benzocyclobutene) can be used. In particular, it is preferable to use acrylic, which has superior levelness for the second interlayer insulating film 5056, because it is formed with a strong implication of leveling. An acrylic film is formed in Embodiment 9 at a film thickness at which steps formed by the TFTs can be sufficiently leveled. The film thickness is preferably from 1 to 5 mm (more preferably between 2 and 4 mm).

Formation of the contact holes is done using dry etching or wet etching, and contact holes for reaching the n-type impurity regions 5017, 5018, 5021 and 5023 or the p-type impurity regions 5043 to 5048, a contact hole for reaching, the gate electrodes (not shown in the figure) are formed.

Further, a three layer structure lamination film, in which a 100 nm thick Ti film, a 300 nm thick Al film containing Ti, and a 150 nm thick Ti film are formed in succession by sputtering and then patterned into a predetermined shape, is used for the wirings 5057 to 5061. Of course, other conductive films may be used.

An indium oxide tin oxide (ITO) film is formed as the pixel electrode 5063 with a thickness of 110 nm in Embodiment 9, and patterning is then performed. The contact is attained such that the pixel electrode 5063 is arranged so as to contact and overlap with the connection wiring 5061. Further, a transparent conductive film in which between 2 and 20% zinc oxide (ZnO) is mixed with indium oxide may also be used. The pixel electrode 5063 becomes an anode of an EL element. (FIG. 16A)

Figure 16B:
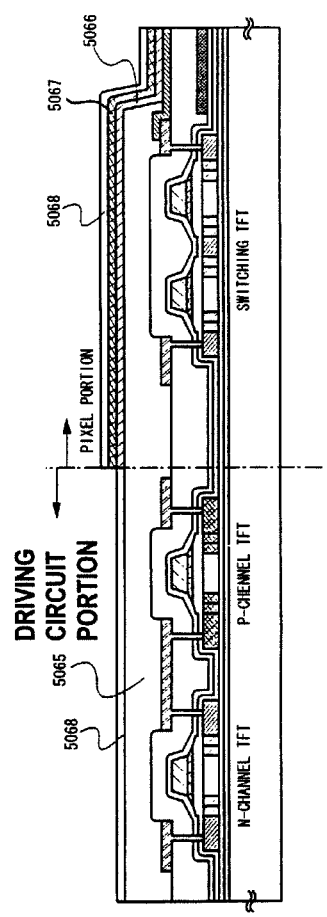

Next, as shown in FIG. 16B, an insulating film containing silicon (a silicon oxide film in Embodiment 9) is formed with a thickness of 500 nm, an open portion is formed in a location corresponding to the pixel electrode 5063, and a third interlayer insulating film 5065 functioning as a bank is formed. Sidewalls can easily be formed into a tapered shape by using wet etching when forming the open portion. If the sidewalls of the open portion are not sufficiently gentle, then there is a conspicuous problem in which the EL layers degrade due to the step.

An EL layer 5066 and a cathode (MgAg electrode) 5067 are formed next in succession, without exposure to the atmosphere, using vacuum evaporation. Note that the film thickness of the EL layer 5066 may be set from 80 to 200 nm (typically between 100 and 120 nm), and the thickness of the cathode 5067 may be set from 180 to 300 nm (typically 200 to 250 nm). In Embodiment 9, since the color filters are used, the EL layer may be a layer emitting only the white light. That is, the pixel need not be dividedly painted.

Note that known materials may be used for the EL layer 5066. Organic materials may be preferably used as the known materials, taking a driver voltage into consideration. For example, a four layer structure of a hole injecting layer, a hole transporting layer, a light emitting layer, and an electron injecting layer may be used. Then, a cathode 5067 is formed. In Embodiment 9, although an example of using an MgAg electrode as the cathode 5067 is shown, the present invention is not limited this. It is also possible to use other known materials for the cathode 5067.

Finally, a passivation film 5068 is formed of a silicon nitride film with a thickness of 300 nm. The EL layers 5066 is protected from moisture or the like, and in addition, the reliability of the EL elements can be additionally increased by forming the passivation film 5068.

The EL display device having a structure like that shown in FIG. 16B is thus completed. Note that, in the manufacturing processes for the EL display device in Embodiment 9, the gate signal lines are formed by Al which is the wiring material used in forming the source and drain electrodes. However, different materials may also be used.

The EL display device of Embodiment 9 has an extremely high reliability, and the operating characteristics are also improved not only in the pixel portion, but also in the driver circuit portion by arranging TFTs having suitable structures. It is also possible to add a metallic catalyst such as Ni in the crystallization step, thereby increasing crystallinity. It therefore becomes possible to set the driving frequency of the source signl line driver circuit to 10 MHz or higher.

First, a TFT having a structure in which hot carrier injection is reduced without even a small drop in the operating speed is used as an n-channel TFT of a CMOS circuit forming the driver circuit portion. Note that the driver circuit referred to here includes circuits such as a shift register, a buffer, a level shifter, and a latch in line-sequential drive.

In Embodiment 9, the active layer of the n-channel TFT contains a source region, a drain region, an overlap LDD region (Lov region) overlapping with a gate electrode via a gate insulating film, an offset LDD region (Loff region) not overlapping with a gate electrode via a gate insulating film, and a channel forming region.

Further, there is not much need to worry about degradation due to hot carrier injection with the p-channel TFT of the CMOS circuit, and therefore LDD regions need not be formed in particular. It is of course possible to form an LDD region similar to that of the n-channel TFT, as a measure against hot carriers.

Note that, in practice, it is preferable to perform packaging (sealing), without exposure to the atmosphere, using a protective film (such as a laminated film or an ultraviolet hardened resin film) having good airtight characteristics and little outgassing, and a transparent sealing material, after completing through the state of FIG. 16B. At this time, the reliability of the EL element is increased by making an inert atmosphere on the inside of the sealing material and by arranging a drying agent (barium oxide, for example) inside the sealing material.

Furthermore, after the airtight properties have been increased in accordance with the packaging process, a connector (flexible printed circuit, FPC) is attached in order to connect terminals drawn from the elements and circuits formed on the substrate with external signal terminals, thereby a finished product is completed.

According to the process shown in Embodiment 9, it is possible to reduce the number of photo masks necessary for the manufacture of the display device. As a result, it can contribute to shorten the manufacturing steps, to lower the manufacturing cost, and to improve the yields.

Embodiment 10

The source signal line driving circuit explained in Embodiment 1 can be fabricated on an insulating substrate by employing TFTs in accordance with the process of Embodiment 9. Thus, a signal line driving circuit can be fabricated of the source signal line driving circuit, not only in an active type EL display device, but also in a passive type EL display device.

Embodiment 11

In an EL display device according to the present invention, a material for an EL layer included in an EL element is not restricted to an organic EL material, but it may well be an inorganic EL material. Since, however, present-day inorganic EL materials require very high driving voltages, TFTs having withstand voltage characteristics which can endure such driving voltages must be employed.

In other words, if an inorganic EL material of still lower driving voltage is developed in the future, it will be readily applicable to the present invention.

Besides, the construction of this embodiment can be optionally combined with the construction of any of Embodiments 1-9.

Embodiment 12

In the present invention, an organic substance which is used for an EL layer may be either a low-molecular organic substance or a high polymer type (high-molecular) organic substance. Known as the low-molecular organic substances are materials which chiefly include $Alq_3$ (tris-8-quinolinolato-aluminum), TPD (triphenylamine derivatives), and the likes. Substances of p conjugate polymer type are mentioned as the high polymer type organic substances. They typically include PPV (polyphenylene vinylene), PVK (polyvinyl carbazole), polycarbonate, and the likes.

The thin film of the high polymer type (high-molecular) organic substance can be formed by a simple method such as spin coating (namely, "solution coating"), dipping, dispensing, printing or ink jetting, and it has a heat-resistant property superior to the thin film of the low-molecular organic substance.

In a case where, in an EL element included in an EL display device according to the present invention, the EL layer of the EL element includes an electron transporting layer and a hole transporting layer, each of the electron transporting layer and the hole transporting layer may well be made of an inorganic material, for example, an amorphous semiconductor such as amorphous Si or amorphous $Si_{1-x}C_x$.

A large quantity of trap levels exist in the amorphous semiconductor, and a large quantity of interstate densities are formed at the interface of the amorphous semiconductor lying in contact with another layer. Therefore, the EL element can be caused to emit light by a lower voltage, and the brightness thereof can be heightened.

The organic EL layer may well be doped with a dopant (impurity) so as to change the color of the emitted light of the organic EL layer. Mentioned as the dopants are DCM1. Nile red, rubren, coumarine 6, TPB, quinacridon, and the likes.

Embodiment 13

In this embodiment, an EL display device according to the present invention will be described with reference to FIGS. 21A and 21B. FIG. 21A is a top plan view showing that state of a TFT substrate formed with EL elements in which the EL elements have been sealed. A block 6801 indicated by a broken line is a source signal side driving circuit, a block 6802 similarly indicated is a gate signal side driving circuit, and a block 6803 similarly indicated is a pixel portion. Besides, numeral 6804 designates a cover member, numeral 6805 a first seal member, and numeral 6806 a second seal member. A filler 6807 (refer to FIG. 21B) is interposed between the TFT substrate 6800 and the inner part of the cover member 6804 surrounded with the first seal member 6805.

Incidentally, numeral 6808 designates connection wiring which serves to transfer signals inputted to the source signal side driving circuit 6801, gate signal side driving circuit 6802 and pixel portion 6803. The connection wiring 6808 receives a video signal and a clock signal from an FPC (flexible printed circuit) 6809 which serves as connection terminals with an external equipment.

Here, a vertical sectional view taken along line A-A' in FIG. 21A is shown in FIG. 21B. By the way, in FIGS. 21A and 21B, the same reference numerals are assigned to the same parts.

As shown in FIG. 21B, the pixel portion 6803 and the source signal side driving circuit 6801 are formed on the substrate 6800. The pixel portion 6803 is formed of a plurality of pixels each of which includes a TFT ("switching TFT") 6851 for controlling current to flow through the EL element, and a pixel electrode 6852 electrically connected to the drain of the switching TFT 6851. In this embodiment, the switching TFT 6851 is made of a p-channel TFT. Besides, the source signal side driving circuit 6801 is formed using CMOS circuits in each of which an n-channel TFT 6853 and a p-channel TFT 6854 are complementarily combined.

Each pixel includes a color filter (R) 6855, a color filter (G) 6856 and a color filter (B) (not shown) under the pixel electrode 6852. Here, the "color filter (R)" is a color filter which extracts red light from white light, the "color filter (G)" is a color filter which extracts green light from the white light, and the "color filter (B)" is a color filter which extracts blue light from the white light.

Since the color filters are fabricated by photolithography, they can be formed at a precision of about 3 mm. In the case of employing the color filters, a light emitting layer suffices to emit only the white light. That is, the pixel need not be dividedly painted using metal masks. It is therefore possible to fine the pixel still further.

Besides, a conventional structure employing no color filters might pose the problem that visible light entering an EL display device from outside excites the light emitting layer of an EL element, so a desired color is not developed. In contrast, when the color filters are disposed as in this embodiment, only light of specified wavelength enters the EL element. In other words, this embodiment can prevent the drawback that the EL element is excited by the external light.

Next, the pixel electrode 6852 is formed of a transparent conductive film, and it functions as the anode of the EL element. In addition, insulating films 6857 are formed at both the ends of the pixel electrode 6852, and the light emitting layer 6858 which emits light in white is formed.

Incidentally, not only an organic material, but also an inorganic material can be employed as the material of the light emitting layer 6858. It is also allowed to employ a multilayer structure in which a light emitting layer is combined with an electron injecting layer, an electron transporting layer, a hole transporting layer or a hole injecting layer.

Besides, each light emitting layer is overlaid with that cathode 6860 of the EL element which is formed of a conductive film having a light intercepting property. The cathode 6860 is common to all the pixels, and is electrically connected to the FPC 6809 via the connection wiring 6808.

Subsequently, the first seal member 6805 is formed by a dispenser or the like, and the cover member 6804 is bonded thereto by spraying a spacer (not shown). Thereafter, the filler 6807 is packed by vacuum injection into a region which is surrounded with the TFT substrate, cover member 6804 and first seal member 6805.

Besides, in this embodiment, barium oxide is added into the filler 6807 as a hygroscopic substance 6861 beforehand. Incidentally, although the hygroscopic substance is added into the filler in this embodiment, it can also be contained in the filler by dispersing it in lumps. Also, although not shown, a hygroscopic substance can be employed as the material of the spacer.

Subsequently, the filler 6807 is hardened by ultraviolet irradiation or heating, whereupon an opening (not shown) formed in the first seal member 6805 is closed. After the closure of the opening of the first seal member 6805, the connection wiring 6808 and the FPC 6809 are electrically connected using a conductive material 6862. Further, the second seal member 6806 is disposed so as to cover the exposed part of the first seal member 6805 and a part of the FPC 6809. A material similar to that of the first seal member 6805 may well be employed for the second seal member 6806.

When the EL elements are sealed with the filler 6807 by the above method, they can be completely shut out, and matters promoting the oxidation of the organic substance, such as water and oxygen, can be prevented from invading from the exterior. Accordingly, the EL display device of high reliability can be fabricated.

Moreover, owing to the adoption of the present invention, an existing production line for liquid crystal display devices can be diverted to sharply curtail the expenses of facility investment, and a plurality of light emitting devices can be produced from a single substrate by a process of high available percentage to sharply curtail the cost of manufacture.

Embodiment 14

Figure 22:
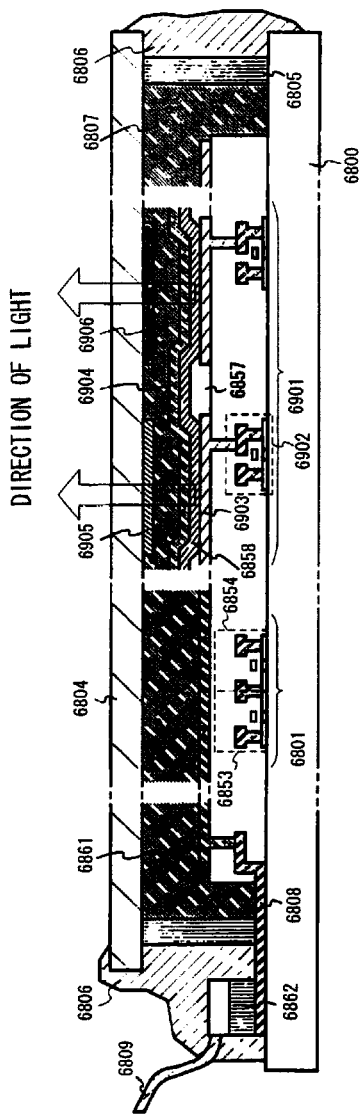
FIG. 22 is a vertical sectional view of the pixel portion of an EL display device embodying the present invention.

In this embodiment, there will be exemplified a case where, in the EL display device explained in Embodiment 13, the radiating direction of light from each EL element and the arrangement of color filters are made different. Reference will be had to FIG. 22, in which different parts are assigned new numerals, and they will be mainly explained because the basic structure of this embodiment is the same as in FIG. 21B.

In this embodiment, an n-channel TFT is employed as each switching TFT 6902 in a pixel portion 6901. Besides, a pixel electrode 6903 is electrically connected to the drain of the switching TFT 6902, and it is formed of a conductive film having a light intercepting property. In this embodiment, the pixel electrode 6903 serves as the cathode of an EL element.

Besides, a transparent conductive film 6904 common to all the pixels of the pixel portion is formed on the light emitting layer 6858 which emits light in white and which is formed by adopting the present invention. The transparent conductive film 6904 serves as the anode of each EL element.

Further, this embodiment features that a color filter (R) 6905, a color filter (G) 6906 and a color filter (B) (not shown) are formed in the cover member 6804. With the structure of the EL element of this embodiment as shown in FIG. 22, light emitted from the light emitting layer 6858 radiates toward the cover member 6804, and hence, the color filters can be disposed in the path of the light.

When the color filter (R) 6905, color filter (G) 6906 and color filter (B) (not shown) are disposed in the cover member 6804 as in this embodiment, there are the advantages that the number of the processing steps of a TFT substrate can be decreased, and that the available percentage and throughput of products can be enhanced.

Embodiment 15

The electronic display device, in particular the EL display device manufactured by applying the present invention can be used in various kinds of electronic equipment. The electronic equipments, which incorporates the electronic display device manufactured by applying the present invention as the display medium, are explained below.

Such electronic equipments include a video camera, a digital camera, a head mounted display (goggle type display), a game machine, a car navigation system, a personal computer, a portable information terminal (a mobile computer, a portable telephone, an electronic book and the like) and the like. Examples of those are shown in FIG. 24.

FIG. 24A shows a personal computer, which contains a main body 2001, a casing 2002, a display portion 2003, a keyboard 2004 and the like. The EL display device of the present invention can be used in the display portion 2003 of the personal computer.

FIG. 24B shows a video camera, which contains a main body 2101, a display portion 2102, a sound input portion 2103, operation switches 2104, a battery 2105, an image receiving portion 2106 and the like. The EL display device of the present invention can be used in the display portion 2102 of the video camera.

FIG. 24C shows a portion (right side) of a head mounted type EL display device, which contains a main body 2301, a signal cable 2302, a head fixing band 2303, a screen monitor 2304, an optical system 2305, a display portion 2306 and the like. The EL display device of the present invention can be used in the display portion 2306 of the head mounted type EL display device.

FIG. 24D shows an image playback device equipped with a recording medium (specifically, a DVD playback device), which contains a main body 2401, a recording medium (such as a CD, an LD or a DVD) 2402, operation switches 2403, a display portion (a) 2404, a display portion (b) 2405 and the like. The display portion (a) is mainly used for displaying image information. The display portion (b) is mainly used for displaying character information. The EL display device of the present invention can be used in the display portions (a) and (b) of the image playback device equipped with the recording medium. Note that the present invention can be applied to devices such as a CD playback device and a game machine as the image playback device equipped with the recording medium.

FIG. 24E shows a mobile computer, which contains a main body 2501, a camera portion 2502, an image receiving portion 2503, operation switches 2504, a display portion 2505 and the like. The EL display device of the present invention can be used in the display portion 2505 of the mobile computer.

Further, if the emission luminance of an EL material is improved in future, the EL material may be used in a front type or rear type projector.

The applicable range of the present invention is extremely wide, as shown above, and it is possible to apply the present invention to electronic equipments in all fields. Further, the electronic equipments of this embodiment can be realized using the constitution in which Embodiments 1 to 14 are freely combined.

In a passive type EL display device in the prior art, a signal line driving circuit is fabricated on a semiconductor substrate.

Therefore, in case of connecting the driving circuit with pixels fabricated on an insulating substrate, disadvantageously a distortion is thermally incurred due to the discrepancy of the materials of the substrates. Besides, in an active type EL display device in the prior art, in a case where the size of each pixel is made small, a proportion occupied by transistors within the pixel enlarges to lessen an aperture factor.

In contrast, owing to the construction described above, the present invention can form the signal line driving circuit on an insulating substrate. Besides, the present invention can enlarge the aperture factor of an active type EL display device. Thus, the invention can provide a passive type EL display device of high reliability. Also, it can provide the active type EL display device of high image quality.

What is claimed is:

1. A display device comprising:
a first substrate;
a pixel portion over the first substrate;
a source driver circuit over the first substrate, the source driver circuit comprising:
a first circuit comprising an op amp;
a second circuit comprising a latch circuit, wherein an output of the second circuit is operationally connected to an input terminal of the first circuit,
a first line electrically connected to the pixel portion, wherein the first line is operationally connected to an output terminal of the first circuit;
a second substrate over the first substrate with the pixel portion, the source driver circuit, and the first line interposed therebetween;
a first sealing material interposed between the first substrate and the second substrate, wherein the first sealing material is disposed along peripheries of the first and second substrates; and
a second sealing material formed outside of the first sealing material, wherein the second sealing material is in contact with side surfaces of the first and second substrates, wherein both the first sealing material and the second sealing material surround the pixel portion.

2. The display device according to claim 1, further comprising a filler filled in an area surrounded by the first sealing material, the first substrate, and the second substrate.

3. The display device according to claim 2, wherein the filler includes a hygroscopic substance.

4. The display device according to claim 3, wherein the hygroscopic substance comprises barium oxide.

5. The display device according to claim 1, wherein the first circuit comprises a constant current circuit.

6. The display device according to claim 1, wherein the input terminal of the first circuit is electrically connected to an output terminal of a time setting circuit, and wherein an input terminal of the time setting circuit is electrically connected to an output terminal of the second circuit.

7. A display module comprising the display device according to claim 1 and an FPC.

8. An electronic equipment comprising the display module according to claim 7 and at least one of an operation switch, a battery, and a sound input portion.

9. The display device according to claim 1, wherein the first line is a source signal line.

10. A display device comprising:
a first substrate;
a pixel portion including a light emitting element over the first substrate;
a source driver circuit over the first substrate, the source driver circuit comprising:
a first circuit comprising an op amp;
a second circuit comprising a latch circuit, wherein an output of the second circuit is operationally connected to an input terminal of the first circuit,
a first line and a second line electrically connected to the pixel portion, wherein the first line is operationally connected to an output terminal of the first circuit and the second line is not directly connected to the first line;
a second substrate over the first substrate with the pixel portion, the source driver circuit, and the first line interposed therebetween;
a first sealing material interposed between the first substrate and the second substrate, wherein the first sealing material is disposed along peripheries of the first and second substrates; and
a second sealing material formed outside of the first sealing material, wherein the second sealing material is in contact with side surfaces of the first and second substrates, wherein both the first sealing material and the second sealing material surround the pixel portion.

11. The display device according to claim 10, further comprising a filler filled in an area surrounded by the first sealing material, the first substrate, and the second substrate.

12. The display device according to claim 11, wherein the filler includes a hygroscopic substance.

13. The display device according to claim 12, wherein the hygroscopic substance comprises barium oxide.

14. The display device according to claim 10, wherein the first circuit comprises a constant current circuit.

15. The display device according to claim 10, wherein the input terminal of the first circuit is electrically connected to an output terminal of a time setting circuit, and wherein an input terminal of the time setting circuit is electrically connected to an output terminal of the second circuit.

16. A display module comprising the display device according to claim 10 and an FPC.

17. An electronic equipment comprising the display module according to claim 16 and at least one of an operation switch, a battery, and a sound input portion.

18. The display device according to claim 10, wherein the first line is a source signal line.

19. The display device according to claim 10, wherein the second line is a power supply line.

20. A display device comprising:
a first substrate;
a pixel portion over the first substrate;
a source driver circuit over the first substrate, the source driver circuit comprising:
a first circuit comprising an op amp;
a second circuit comprising a latch circuit, wherein an output of the second circuit is operationally connected to an input terminal of the first circuit,
a first line and a second line electrically connected to the pixel portion, wherein the first line is operationally connected to an output terminal of the first circuit and the second line is not directly connected to the first circuit;
a second substrate over the first substrate, wherein the first substrate extends beyond an edge of the second substrate;
a first sealing material interposed between the first substrate and the second substrate, wherein the first sealing material is disposed along peripheries of the first and second substrates; and
a second sealing material formed outside of the first sealing material, wherein the second sealing material is in contact with side surfaces of the first and second substrates, wherein a portion of the second sealing material is disposed over an upper surface of the first substrate which extends beyond the edge of the second substrate, and wherein both the first sealing material and the second sealing material surround the pixel portion.

21. The display device according to claim 20, further comprising a filler filled in an area surrounded by the first sealing material, the first substrate, and the second substrate.

22. The display device according to claim 21, wherein the filler includes a hygroscopic substance.

23. The display device according to claim 22, wherein the hygroscopic substance comprises barium oxide.

24. The display device according to claim 20, wherein the first circuit comprises a constant current circuit.

25. The display device according to claim 20, wherein the input terminal of the first circuit is electrically connected to an output terminal of a time setting circuit, and wherein an input terminal of the time setting circuit is electrically connected to an output terminal of the second circuit.

26. A display module comprising the display device according to claim 20 and an FPC.

27. An electronic equipment comprising the display module according to claim 26 and at least one of an operation switch, a battery, and a sound input portion.

28. The display device according to claim 20, wherein the first line is a source signal line.

29. The display device according to claim 20, wherein the second line is a power supply line.

* * * * *

UNITED STATES PATENT AND TRADEMARK OFFICE
CERTIFICATE OF CORRECTION

| | | |
|---|---|---|
| PATENT NO. | : 8,659,516 B2 | |
| APPLICATION NO. | : 13/650441 | |
| DATED | : February 25, 2014 | |
| INVENTOR(S) | : Koyama | |

It is certified that error appears in the above-identified patent and that said Letters Patent is hereby corrected as shown below:

In the Specification

Column 7, line 43, after "respectively" replace ":" with --;--;

Column 9, line 42, replace "L1.4" with --L1,4--;

Column 10, line 16, replace "L1.4" with --L1,4--;

Column 10, line 22, replace "LAT3.1" with --LAT3,1--;

Column 10, line 29, replace "LAT3.1" with --LAT3,1--;

Column 10, line 42, replace "LAT3.1" with --LAT3,1--;

Column 10, line 45, replace "L1.1" with --L1,1--;

Column 10, line 46, replace "L1.2" with --L1,2--;

Column 10, line 65, replace "L1.1" with --L1,1--;

Column 11, line 12, replace "O-bit" with --4-bit--;

Column 11, line 37, after "source" replace "11" with --I1--;

Column 15, line 1, after "resin" replace "." with --,--;

Column 17, line 22, after "R(red)" replace "." with --,--;

Column 17, line 29, after "Kluge" replace "." with --,--;

Column 17, line 30, after "Display" replace "." with --,--;

Column 17, line 31, after "1999" replace "." with --,--;

Column 19, line 66, replace "a" with --α--;

Column 20, line 22, after "Mo" replace "." with --,--;

Column 20, line 63, before "time" delete "to";

Column 23, line 24, after "reaching" delete ",";

Column 24, line 22, replace "signl" with --signal--.

Signed and Sealed this
Fifth Day of August, 2014

Michelle K. Lee
*Deputy Director of the United States Patent and Trademark Office*